US006977599B2

(12) United States Patent
Widmer

(10) Patent No.: US 6,977,599 B2
(45) Date of Patent: Dec. 20, 2005

(54) 8B/10B ENCODING AND DECODING FOR HIGH SPEED APPLICATIONS

(75) Inventor: Albert X. Widmer, Katonah, NY (US)

(73) Assignee: International Business Machines Corporation, Armonk, NY (US)

( * ) Notice: Subject to any disclaimer, the term of this patent is extended or adjusted under 35 U.S.C. 154(b) by 124 days.

(21) Appl. No.: 10/475,823

(22) PCT Filed: Apr. 30, 2002

(86) PCT No.: PCT/US02/13798
§ 371 (c)(1),
(2), (4) Date: Oct. 23, 2003

(87) PCT Pub. No.: WO02/091586
PCT Pub. Date: Nov. 14, 2002

(65) Prior Publication Data
US 2004/0135710 A1 Jul. 15, 2004

Related U.S. Application Data
(60) Provisional application No. 60/289,556, filed on May 8, 2001.

(51) Int. Cl.[7] ............................................. H03M 7/00
(52) U.S. Cl. ........................................... 341/59; 341/50
(58) Field of Search ............................ 341/59, 50, 51, 341/61, 65

(56) References Cited

U.S. PATENT DOCUMENTS 6,691,275 B1 * 2/2004 Jaeckel ....................... 714/752

* cited by examiner

Primary Examiner—Peguy JeanPierre
Assistant Examiner—Joseph Lauture
(74) Attorney, Agent, or Firm—Ryan, Mason & Lewis, LLP

(57) ABSTRACT

During decoding and encoding, the starting disparity of a current block is computed by using a disparity at some previous reference point and disparity characteristics of bytes from the reference point to a current block boundary. The characteristics of the bytes are whether the bytes are unbalanced coded vectors and whether the number of unbalanced vectors is even or odd. Alternately, the characteristics of the bytes are whether the bytes are balanced and how many balanced coded vectors exist. New classifications are created for encoding and decoding 3B/4B and 5B/6B transmission codes. Separate functions are created that address specifically disparity aspects. A dispartiy violation at the front of a byte is detected during decoding by comparing a required front-end disparity of the byte with the actual running disparity by assuming the actual running disparity is equivalent to an exit disparity of the next preceding byte that is disparity dependent.

38 Claims, 24 Drawing Sheets

FIG. 1

| Name | ABCDE K | Coding Class | Primary abcdei | Alternate abcdei | DR Class | DR | DB Class | DB |
|---|---|---|---|---|---|---|---|---|
| D0 | 00000 0 | L03·D' | 011000 | 100111 | L03·(D+E') | + | | |
| D1 | 10000 0 | L12·D'·E' | 100010 | 011101 | L12·D'·E' | + | | |
| D2 | 01000 0 | L12·D'·E' | 010010 | 101101 | L12·D'·E' | + | | |
| D3 | 11000 0 | L21·D'·E' | 110001 | . | | ± | L21·(D'+E') | 0 |
| D4 | 00100 0 | L12·D'·E' | 001010 | 110101 | L12·D'·E' | + | | |
| D5 | 10100 0 | L21·D'·E' | 101001 | | | ± | L21·(D'+E') | 0 |
| D6 | 01100 0 | L21·D'·E' | 011001 | | | ± | L21·(D'+E') | 0 |
| D7 | 11100 0 | | 111000 | 000111 | L30·(D'+E) | − | L30·D'·E' | 0 |
| D8 | 00010 0 | L03·D·E' | 000110 | 111001 | L03·(D+E') | + | | |
| D9 | 10010 0 | L12·(D≠E) | 100101 | | | ± | L12·(D+E)·K' | 0 |
| D10 | 01010 0 | L12·(D≠E) | 010101 | | | ± | L12·(D+E)·K' | 0 |
| D11 | 11010 0 | L21·D·E' | 110100 | | | ± | L21·(D'+E') | 0 |
| D12 | 00110 0 | L12·(D≠E) | 001101 | | | ± | L12·(D+E)·K' | 0 |
| D13 | 10110 0 | L21·D·E' | 101100 | | | ± | L21·(D'+E') | 0 |
| D14 | 01110 0 | L21·D·E' | 011100 | | | ± | L21·(D'+E') | 0 |
| D15 | 11110 0 | L30·D | 101000 | 010111 | L30·D·E' | + | | |
| D16 | 00001 0 | L03·D', L03·D'·E | 011011 | 100100 | L03·D'·E | − | | |
| D17 | 10001 0 | L12·(D≠E) | 100011 | | | ± | L12·(D+E)·K' | 0 |
| D18 | 01001 0 | L12·(D≠E) | 010011 | | | ± | L12·(D+E)·K' | 0 |
| D19 | 11001 0 | | 110010 | | | ± | L21·(D'+E') | 0 |
| D20 | 00101 0 | L12·(D≠E) | 001011 | | | ± | L12·(D+E)·K' | 0 |
| D21 | 10101 0 | | 101010 | | | ± | L21·(D'+E') | 0 |
| D22 | 01101 0 | | 011010 | | | ± | L21·(D'+E') | 0 |
| D/K23 | 11101 x | | 111010 | 000101 | L30·(D'+E) | − | | |
| D24 | 00011 0 | L03·D·E, L03·D | 001100 | 110011 | L03·(D+E') | + | | |
| D25 | 10011 0 | | 100110 | | | ± | L12·(D+E)·K' | 0 |
| D26 | 01011 0 | | 010110 | | | ± | L12·(D+E)·K' | 0 |
| D/K27 | 11011 x | | 110110 | 001001 | L21·D·E | − | | |
| D28 | 00111 0 | | 001110 | | | ± | L12·(D+E)·K' | 0 |
| K28 | 00111 1 | L12·K | 001111 | 110000 | K | − | | |
| D/K29 | 10111 x | | 101110 | 010001 | L21·D·E | − | | |
| D/K30 | 01111 x | | 011110 | 100001 | L21·D·E | − | | |
| D31 | 11111 0 | L30·D, L30·D·E | 101011 | 010100 | L30·(D'+E) | − | | |

FIG. 2

| Name | FGH KM | Coding Class | Primary fghj | Alternate fghj | DR Class | DR | DB Class | DB |
|---|---|---|---|---|---|---|---|---|
| D/Kx.0[1] | 000 x0 | F'·G'·H' | 0100 | 1011 | F'·G' | + | | |
| Dx.1 | 100 00 | (F≠G)·H' | 1001 | | | ± | (F≠G) | 0 |
| K28.1 | 100 10 | (F≠G)·H' | 1001 | 0110 | (F≠G)·K | + | (F≠G) | 0 |
| Dx.2 | 010 00 | (F≠G)·H' | 0101 | | | ± | (F≠G) | 0 |
| K28.2 | 010 10 | (F≠G)·H' | 0101 | 1010 | (F≠G)·K | + | (F≠G) | 0 |
| D/Kx.3[1] | 110 x0 | | 1100 | 0011 | F·G | − | F·G·H' | 0 |
| D/Kx.4[1] | 001 x0 | | 0010 | 1101 | F'·G' | + | | |
| Dx.5 | 101 00 | | 1010 | | | ± | (F≠G) | 0 |
| K28.5 | 101 10 | | 1010 | 0101 | (F≠G)·K | + | (F≠G) | 0 |
| Dx.6 | 011 00 | | 0110 | | | ± | (F≠G) | 0 |
| K28.6 | 011 10 | | 0110 | 1001 | (F≠G)·K | + | (F≠G) | 0 |
| Dx.P7 | 111 00 | | 1110 | 0001 | F·G | − | | |
| Dx.A7[2] | 111 00 | F·G·H·S | 0111 | 1000 | F·G | − | | |
| Ky.A7[3] | 111 10 | F·G·H·K | 0111 | 1000 | F·G | − | | |

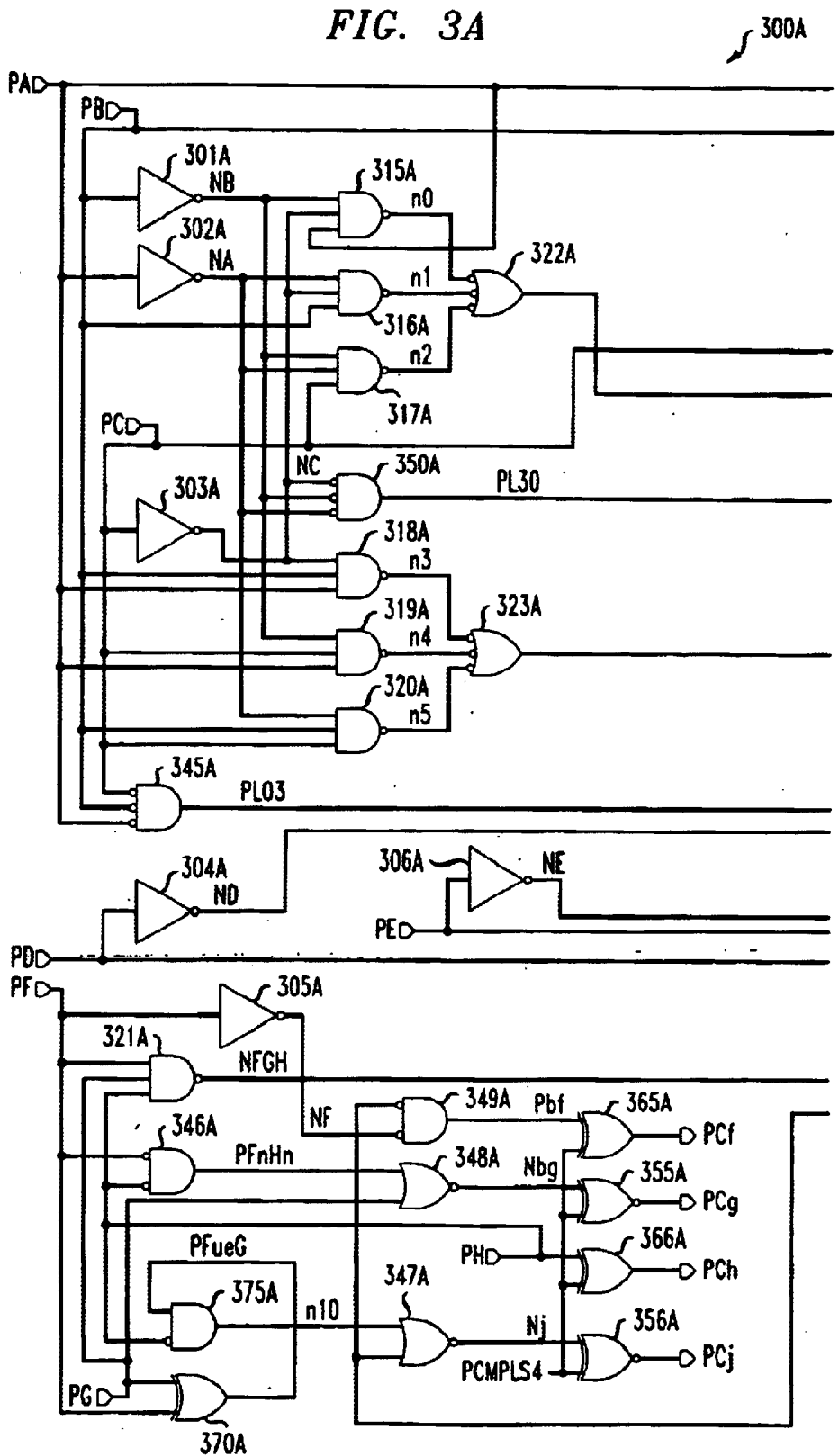

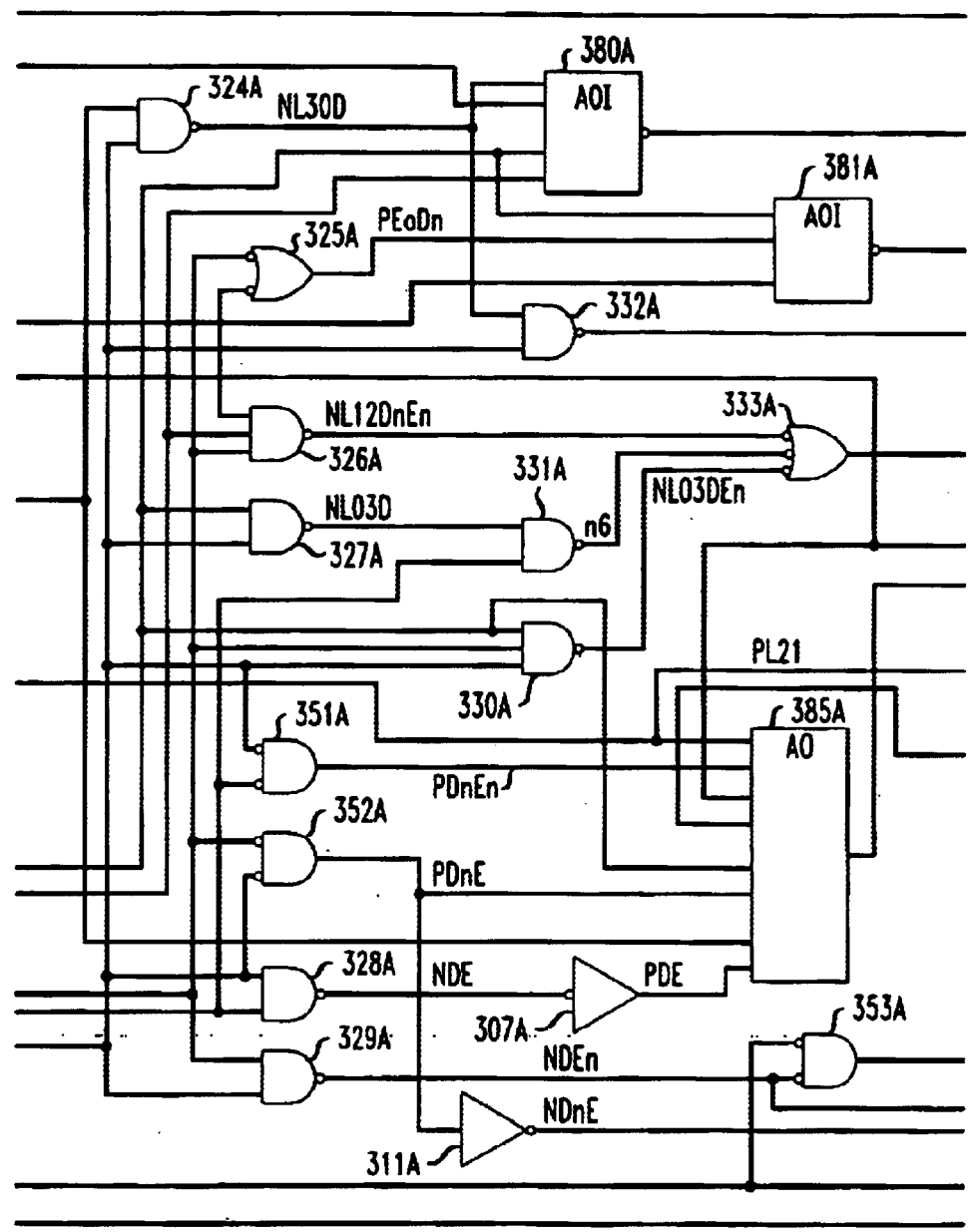
FIG. 3A cont. (a)

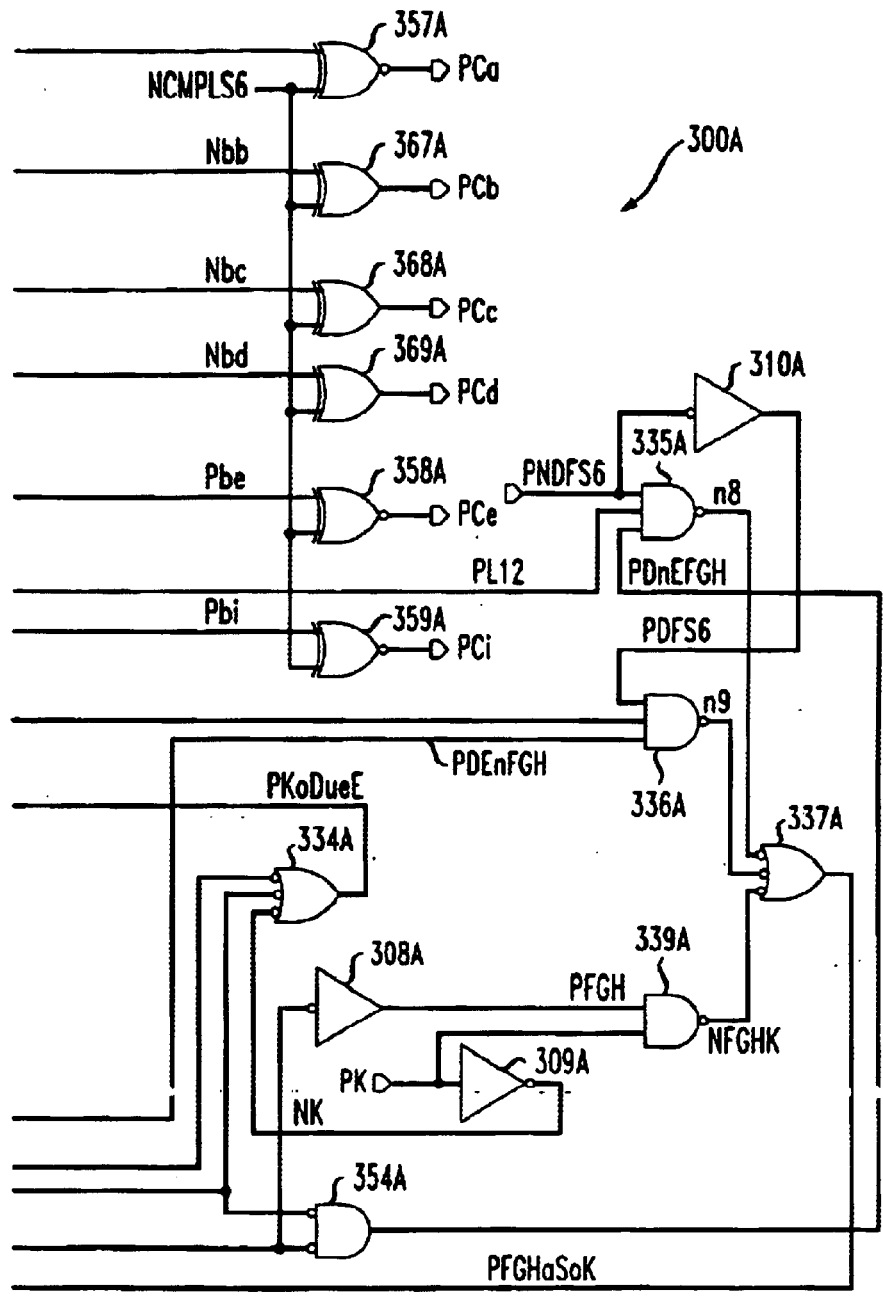
FIG. 3A cont. (b)

FIG. 9

| Name | abcdei | Decoding Class | ABCDE K | DR Class | DR | DU Class | DU |
|---|---|---|---|---|---|---|---|
| D0 | 011000 | a'·b·c·d'·(e=i) | 0 0 0 0 0 0 | (a·b·c)'·d'·e'·i' | + | d'·e'·i' | − |
| D0 | 100111 | a·b'·c'·d·(e=i) | 0 0 0 0 0 0 | (a'·b'·c')'·d·e·i | − | d·e·i | + |
| D1 | 100010 | Px3·i' | 1 0 0 0 0 0 | Px3·(e'+i') | + | Px3·(e'+i') | − |
| D1 | 011101 | P3x·i | 1 0 0 0 0 0 | P3x·(e+i) | − | P3x·(e+i) | + |
| D2 | 010010 | Px3·i' | 0 1 0 0 0 0 | Px3·(e'+i') | + | Px3·(e'+i') | − |
| D2 | 101101 | P3x·i | 0 1 0 0 0 0 | P3x·(e+i) | − | P3x·(e+i) | + |
| D3 | 110001 |  | 1 1 0 0 0 0 |  | ± |  |  |
| D4 | 001010 | Px3·i' | 0 0 1 0 0 0 | Px3·(e'+i') | + | Px3·(e'+i') | − |
| D4 | 110101 | P3x·i | 0 0 1 0 0 0 | P3x·(e+i) | − | P3x·(e+i) | + |
| D5 | 101001 |  | 1 0 1 0 0 0 |  | ± |  |  |
| D6 | 011001 |  | 0 1 1 0 0 0 |  | ± |  |  |
| D7 | 111000 |  | 1 1 1 0 0 0 | a·b·c | − | d'·e'·i' | − |
| D7 | 000111 | Px3·d·i | 1 1 1 0 0 0 | a'·b'·c' | + | d·e·i | + |
| D8 | 000110 | Px3·i' | 0 0 0 1 0 0 | Px3·(e'+i') | + | Px3·(e'+i') | − |
| D8 | 111001 | P3x·i | 0 0 0 1 0 0 | P3x·(e+i) | − | P3x·(e+i) | + |
| D9 | 100101 |  | 1 0 0 1 0 0 |  | ± |  |  |
| D10 | 010101 |  | 0 1 0 1 0 0 |  | ± |  |  |
| D11 | 110100 |  | 1 1 0 1 0 0 |  | ± |  |  |
| D12 | 001101 |  | 0 0 1 1 0 0 |  | ± |  |  |
| D13 | 101100 |  | 1 0 1 1 0 0 |  | ± |  |  |
| D14 | 011100 |  | 0 1 1 1 0 0 |  | ± |  |  |
| D15 | 101000 | a·b'·c·d'·(e=i) | 1 1 1 1 0 0 | (a·b·c)'·d'·e'·i' | + | d'·e'·i' | − |
| D15 | 010111 | a'·b·c'·d·(e=i) | 1 1 1 1 0 0 | (a'·b'·c')'·d·e·i | − | d·e·i | + |
| D16 | 011011 | a'·b·c·d'·(e=i) | 0 0 0 0 1 0 | P2x·e·i | − | P2x·e·i | + |
| D16 | 100100 | a·b'·c'·d·(e=i) | 0 0 0 0 1 0 | Px2·e'·i' | + | Px2·e'·i' | − |
| D17 | 100011 |  | 1 0 0 0 1 0 |  | ± |  |  |
| D18 | 010011 |  | 0 1 0 0 1 0 |  | ± |  |  |
| D19 | 110010 |  | 1 1 0 0 1 0 |  | ± |  |  |
| D20 | 001011 |  | 0 0 1 0 1 0 |  | ± |  |  |
| D21 | 101010 |  | 1 0 1 0 1 0 |  | ± |  |  |
| D22 | 011010 |  | 0 1 1 0 1 0 |  | ± |  |  |
| D/K23 | 111010 |  | 1 1 1 0 1 x | P3x·(e+i) | − | P3x·(e+i) | + |
| D/K23 | 000101 | Px3·e' | 1 1 1 0 1 x | Px3·(e'+i') | + | Px3·(e'+i') | − |

FIG. 9 (cont)

| | | | | | | | |
|---|---|---|---|---|---|---|---|
| D24 | 001100 | a'•b'•e'•i' | 00011 0 | Px2•e'•i' | + | Px2•e'•i' | - |
| D24 | 110011 | a•b•e•i | 000110 | P2x•e•i | - | P2x•e•i | + |
| D25 | 100110 | | 100110 | | ± | | |
| D26 | 010110 | | 010110 | | ± | | |
| D/K27 | 110110 | | 11011 x | P3x•(e+i) | - | P3x•(e+i) | + |
| D/K27 | 001001 | Px3•e' | 11011 x | Px3•(e'+i') | + | Px3•(e'+i') | - |
| D28 | 001110 | | 001110 | | ± | | |
| K28 | 001111 | c•d•e•i | 001111 | (a'•b'•c')'•d•e•i | - | d•e•i | + |
| K28 | 110000 | c'•d'•e'•i' | 001111 | (a•b•c)'•d'•e'•i' | + | d'•e'•i' | - |
| D/K29 | 101110 | | 10111 x | P3x•(e+i) | - | P3x•(e+i) | + |
| D/K29 | 010001 | Px3•e' | 10111 x | Px3•(e'+i') | + | Px3•(e'+i') | - |
| D/K30 | 011110 | | 01111 x | P3x•(e+i) | - | P3x•(e+i) | + |
| D/K30 | 100001 | Px3•e' | 01111 x | Px3•(e'+i') | + | Px3•(e'+i') | - |
| D31 | 101011 | a•b'•c•d'•(e=i) | 111110 | P2x•e•i | - | P2x•e•i | + |
| D31 | 010100 | a'•b•c'•d•(e=i) | 111110 | Px2•e'•i' | + | Px2•e'•i' | - |

FIG. 11

| Name | fghj | Decoding Class | FGH K | DR Class | DR | DU Class | DU |
|---|---|---|---|---|---|---|---|
| D/Kx.0 | 0 1 0 0 | (f≠g)•h'•j' | 0 0 0 x | (f≠g)•h'•j' | + | h'•j' | − |
| D/Kx.0 | 1 0 1 1 | (f≠g)•h•j, f•g'•(h=j) | 0 0 0 x | (f≠g)•h•j | − | h•j | + |
| D/Kx.1 | 1 0 0 1 |  | 1 0 0 x |  | ± |  |  |
| K28.1 | 0 1 1 0 | c'•d'•e'•i'•(h≠j) | 1 0 0 1 |  |  |  |  |
| D/Kx.2 | 0 1 0 1 |  | 0 1 0 x |  | ± |  |  |
| K28.2 | 1 0 1 0 | c'•d'•e'•i'•(h≠j) | 0 1 0 1 |  |  |  |  |
| D/Kx.3 | 1 1 0 0 |  | 1 1 0 x | f•g | − | h'•j' | − |
| D/Kx.3 | 0 0 1 1 | (f=g)•j | 1 1 0 x | f'•g' | + | h•j | + |
| D/Kx.4 | 0 0 1 0 |  | 0 0 1 x | f'•g' | + | f'•g'•(h≠j) | − |
| D/Kx.4 | 1 1 0 1 | (f=g)•j | 0 0 1 x | f•g | − | f•g•(h≠j) | + |
| D/Kx.5 | 1 0 1 0 |  | 1 0 1 x |  | ± |  |  |
| K28.5 | 0 1 0 1 | c'•d'•e'•i'•(h≠j) | 1 0 1 1 |  |  |  |  |
| D/Kx.6 | 0 1 1 0 |  | 0 1 1 x |  | ± |  |  |
| K28.6 | 1 0 0 1 | c'•d'•e'•i'•(h≠j) | 0 1 1 1 |  |  |  |  |
| Dx.7 | 1 1 1 0 |  | 1 1 1 0 | f•g | − | f•g•(h≠j) | + |
| Dx.7 | 0 0 0 1 | (f=g)•j | 1 1 1 0 | f'•g' | + | f'•g'•(h≠j) | − |
| D/Kx.7 | 0 1 1 1 | (f≠g)•h•j | 1 1 1 x | (f≠g)•h•j | − | h•j | + |
| D/Kx.7 | 1 0 0 0 | (f≠g)•h'•j', f•g'•(h=j) | 1 1 1 x | (f≠g)•h'•j' | + | h'•j' | − |

*FIG. 12*

| Classifications | A=a | B=b | C=c | D=d | E=e | F=f | G=g | H=h | K=0 |
|---|---|---|---|---|---|---|---|---|---|
| a'•b•c•d'•(e=i) |  | F | F |  |  |  |  |  |  |
| a•b'•c'•d'•(e=i) | F |  |  | F | F |  |  |  |  |
| Px3•i' |  |  |  |  | F |  |  |  |  |
| P3x•i | F | F | F | F |  |  |  |  |  |
| a•b'•c•d'•(e=i) |  | F |  | F |  |  |  |  |  |
| a'•b•c'•d•(e=i) | F |  | F |  | F |  |  |  |  |
| a'•b'•e'•i' |  |  | F |  | F |  |  |  |  |
| a•b•e•i | F | F |  | F |  |  |  |  |  |
| Px 3•(d•i+e')+c'•d'•e'•i' | F | F | F | F | F |  |  |  |  |
| (f≠g)•h•j |  |  |  |  |  | F |  |  |  |
| (f≠g)•h'•j' |  |  |  |  |  |  | F |  |  |
| f•g'•(h=j) |  |  |  |  |  |  |  | F |  |
| (f=g)•j + c'•d'•e'•i'•(h≠j) |  |  |  |  |  | F | F | F |  |
| K28¹  ² |  |  |  |  |  |  |  |  | F |

8B/10B ENCODING AND DECODING FOR HIGH SPEED APPLICATIONS

CROSS REFERENCE TO RELATED APPLICATIONS

This application is a national stage entry of PCT/US02/13798 filed Apr. 30, 2002 which claims the benefit of U.S. Provisional Application No. 60/289,556, filed May 8, 2001, the disclosure of which is hereby incorporated by reference.

TECHNICAL FIELD

The present invention relates to transmission codes and, more particularly, relates to 8B/10B encoding and decoding for high speed applications.

BACKGROUND ART

Serialized, self-timed chip input-output (I/O) is gaining momentum. It is expected to replace many wide bi-directional and shared buses by creating separate high-speed, serial communication lanes. The 8B/10B transmission code described in U.S. Pat. No. 4,486,739, by Franaszek and Widmer, entitled "Byte Oriented DC Balanced (0,4) 8B/10B Partition Block Transmission Code," the disclosure of which is hereby incorporated by reference, is well entrenched in the industry for this kind of application because of its easy implementation and transmission characteristics.

For a detailed discussion of the 8B/10B transmission code, see U.S. Pat. No. 4,486,739. Generally, in an 8B/10B transmission code, a ten-bit vector is created from a six-bit coded vector and a four-bit coded vector. The six-bit coded vector is created from a five-bit source vector. Similarly, the four-bit coded vector is created from a three-bit source vector. The coded vectors are created and combined in such a way as to reduce or eliminate any Direct Current (DC) components in a stream of coded vectors. Coded (and source) vectors have disparity. The disparity of a block of data is the difference between the number of ones and zeros in the block. Positive and negative disparity numbers refer to an excess of ones or zeros, respectively. Disparity is used to determine what coded vector is transmitted. For instance, unbalanced coded vectors have primary and alternate coded vectors, and the selection of whether the primary coded vector or the alternate coded vector is chosen for transmission is determined by disparity. An unbalanced coded vector has a disparity that is not zero. As an example, a source vector having three bits could be 000. A primary coded vector for a 3B/4B transmission code corresponding to this source vector is 0100. An alternate coded vector corresponding to this source vector is 1011 (i.e., the bitwise inverse of 0100). The primary vector is chosen if the disparity prior to the coded vector is positive and the alternate vector is chosen if the disparity prior to the coded vector is negative. Additional details about disparity and rules concerning disparity are found in U.S. Pat. No. 5,245,339.

A clear trend is to higher transmission speed, which traditionally has been handled by multiple coder-decoder (CoDec) circuits in parallel. For example, U.S. Pat. No. 5,245,339, by Cideciyan, entitled "Flexible Encoding Method and Architecture for High Speed Data Transmission and Storage," the disclosure of which is hereby incorporated by reference, teaches an improved method of operating multiple encoders in parallel.

However, there is still a need to further increase the speeds of encoding and decoding when using 8B/10B transmission codes.

DISCLOSURE OF INVENTION

The present invention provides techniques that increase encoding and decoding speed when encoding and decoding, respectively, using 8B/10B transmission codes. In one aspect of the present invention, the starting disparity of a current block is computed, during encoding for an 8B/10B transmission code, by using a disparity at some previous reference point and disparity characteristics of bytes from the reference point to a current block boundary. A block in a 8B/10B transmission code is usually a byte, thus the block boundary used will generally be a byte boundary. However, multiple bytes may be used to create a block. In one embodiment, the characteristics of the bytes are whether the bytes are unbalanced coded vectors and whether the number of unbalanced vectors is even or odd. In another embodiment, the characteristics of the bytes are whether the bytes are balanced and how many balanced coded vectors exist. This aspect has at least the advantages of a shorter delay, as compared to conventional designs, for encoding with a single 8B/10B encoder and a much shorter delay for encoding with multiple 8B/10B encoders operating in parallel.

In second and third aspects of the invention, new classifications, which offer lower delay than conventional classifications, are created for encoding and decoding 3B/4B and 5B/6B transmission codes. Additionally, separate functions are created that address specifically disparity aspects of the transmission codes.

In a fourth aspect of the invention, during decoding, a current reference disparity at the beginning of a block is determined based on stored disparity attributes from a previous block. In one embodiment, the stored disparity attributes from the preceding block are an exit disparity of the preceding block and a reference polarity of the preceding block. In another embodiment, the current reference disparity at the beginning of a block is positive if at least one of the two following conditions are met: (1) the exit disparity of the preceding block is positive; and (2) the reference disparity at the beginning of the preceding block is positive and the exit polarity of the preceding block is non-negative. In another embodiment, a disparity violation at the front of a byte is detected during decoding by comparing a required front-end disparity of the byte with the actual running disparity by assuming the actual running disparity is equivalent to an exit disparity of the next preceding byte that is disparity dependent.

A more complete understanding of the present invention, as well as further features and advantages of the present invention, will be obtained by reference to the following detailed description and drawings.

BRIEF DESCRIPTION OF DRAWINGS

FIG. 1 shows a table for encoding five-bit source vectors into six-bit coded vectors for use with an 8B/10B transmission code in accordance with one embodiment of the present invention;

FIG. 2 shows a table for encoding three-bit source vectors into four-bit coded vectors for use with an 8B/10B transmission code in accordance with one embodiment of the present invention;

FIG. 3A illustrates an exemplary circuit for encoding using 8B/10B transmission codes in accordance with one embodiment of the present invention;

FIG. 9 illustrates a table used for decoding a 6B/5B portion of a 10B/8B transmission code, in accordance with one embodiment of the present invention;

FIG. 11 illustrates a table used for decoding a 4B/3B portion of a 100B/8B transmission code, in accordance with one embodiment of the present invention;

FIG. 12 illustrates a table used to determine for which classes in a 10B/8B transmission code particular bits should be inverted, in accordance with one embodiment of the present invention;

BEST MODES FOR CARRYING OUT THE INVENTION

Figure 3B:
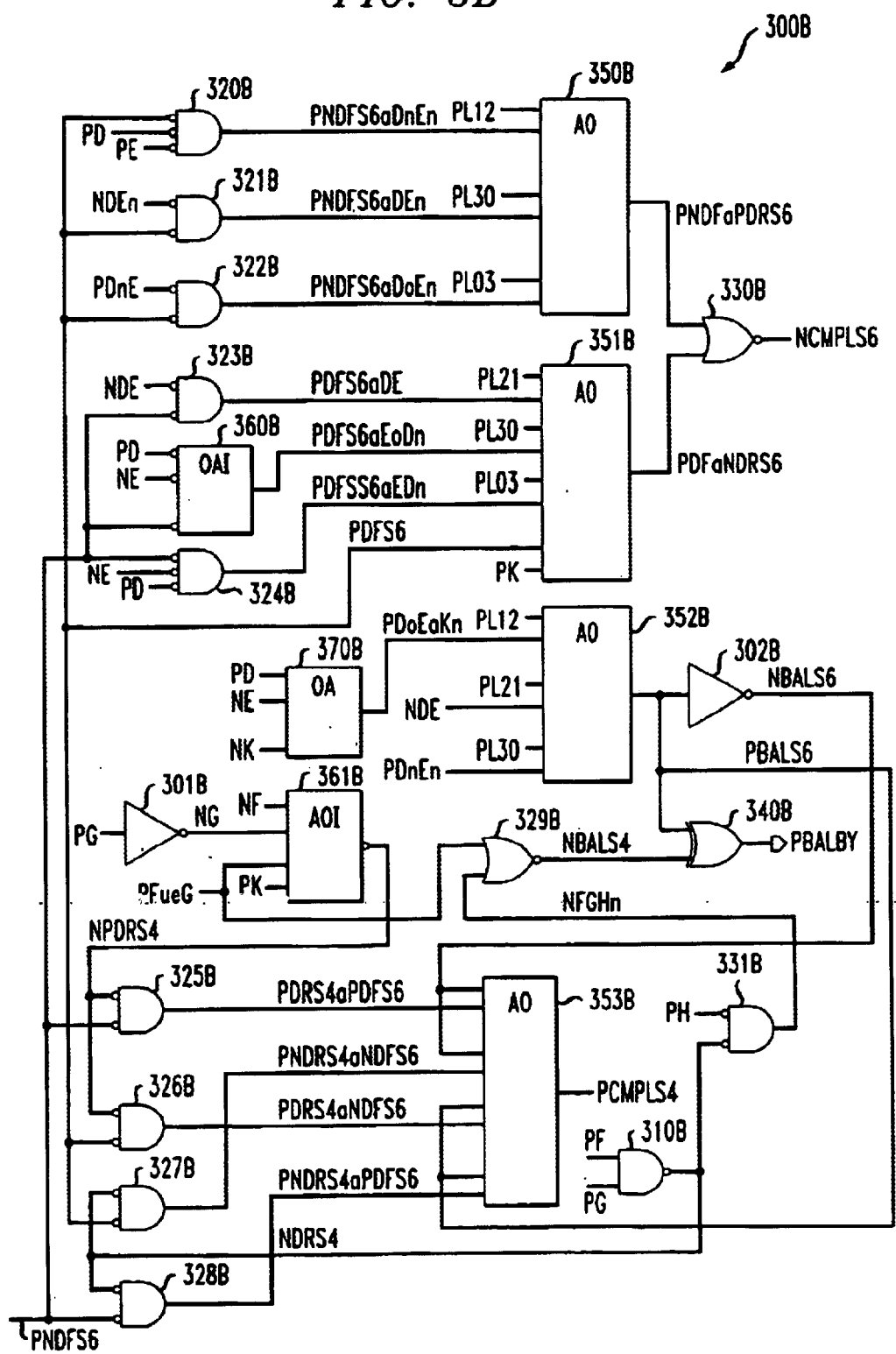
FIG. 3B illustrates an exemplary circuit for disparity control when encoding using 8B/10B transmission codes in accordance with one embodiment of the present invention.

The present invention goes beyond the disclosures of U.S. Pat. No. 5,245,339 and U.S. Pat. No. 4,486,739 through at least the following improvements. New vector classifications are developed for the mapping to and from the coded domain, which leads to coding and decoding equations with generally shorter delay. The 8B/10B code itself is unchanged. The disparity for both the coding and decoding process is handled by separate rather than shared classifications and the extra number of circuits required is small. In U.S. Pat. No. 4,486,739, shared classifications are used. While traditional circuits present the running disparity at the end of a byte or block of bytes together with the coded or decoded data, aspects of the present invention take advantage of the fact that it is not necessary to immediately know the polarity of the running disparity at the start of the encoding or decoding and error checking processes. So, instead of the ending disparity, the starting disparity of the current byte together with certain characteristics of the current byte are passed along to the next byte interval via latches or delay elements. The starting disparity of the next byte is then computed during the early part of the next cycle concurrently with bit mapping, error checking, and disparity classification of the new byte. These two innovations will allow many applications to operate with a single CoDec circuit rather than two or four, or two instead of four. For very short range applications, the reduced latency of a single CoDec may be more important than the circuit savings. Increased latency with multiple CoDec circuits is associated with single byte lanes because it takes extra time to assemble and disassemble several bytes in parallel if not needed for other reasons.

For implementations with multiple CoDec circuits operating in parallel, it is also not necessary, when using aspects of the present invention, to obtain the ending disparity of the respective multiple byte blocks. Instead, the starting disparity of the current block may be derived from the disparity value at some preceding reference point and certain characteristics of the bytes up to the new reference point.

For the encoding process, the running disparity from the preceding reference point is changed when the number of unbalanced coded vectors up to the new reference point is odd and remains unchanged otherwise. The same is true for the number of balanced vectors if the total number of vectors back to the reference is even.

The decoding process does not appear to be addressed explicitly by U.S. Pat. No. 5,245,339. Disparity plays no role in the bit mapping for decoding, but the conformance with disparity rules is checked for error detection purposes and this logic path can be one of the bottlenecks in some of the traditional designs. The disparity check circuits of the present invention classify the coded bytes into those which are disparity dependent or independent, which is different than being balanced or unbalanced. Disparity independent bytes are ignored. Disparity dependent bytes assume either a positive or a negative exit disparity depending solely on the bit patterns in the byte regardless of the running disparity at the start of the byte. For error checking purposes, the running disparity at any point is equal to the exit disparity of the most recent disparity dependent byte. For the example of four parallel bytes, this can be determined by four independent sets of combinatorial logic simultaneously, i.e. the disparity in front of byte number three is obtained without knowledge of the disparity on front of the preceding bytes, as is required for some designs with longer delays. The disparity at the front of the four-byte block is derived from the disparity value at the front of the last byte (circuit 1713) of the preceding block and the disparity characteristics of that byte. An improvement in the delay margin can be obtained by deferring this evaluation to the next block cycle.

The 8B/10B CoDec circuit designs presented here attempt to deliver the best possible speed and exploit the characteristics of a standard cell library for the IBM CMOS-7S or similar technology to the fullest. The CMOS-7S is described in IBM Microelectronics ASIC SA-27 Databook, SA14-2214-01 (1998), the disclosure of which is hereby incorporated by reference. Implementations with both a single CoDec circuit and parallel circuits are shown herein.

Speed improvements over conventional techniques are accomplished by the following steps:

1. New coding and decoding tables have been generated with new classifications. While the old classifications (e.g., such as used in U.S. Pat. No. 4,486,739) relied heavily on 4-variable functions, the new classifications rely more on 3-variable functions, which can be implemented with less delay.

2. Separate functions have been defined that address specifically the disparity aspects. This increases speed because functions that address the disparity aspects can be modified for higher speed, instead of having these functions lumped in with the coding aspects. The balance of coded bytes is determined directly from the input bits rather than indirectly from the absence of positive or negative 6B or 4B vectors. In other words, previously the balance was determined by assuming the byte was balanced unless there was a positive or negative coded vector. The original, convention design for the control of the disparity and complementation relied on the same primitive classifications as were used for the support of bit encoding and decoding to save circuits. Aspects of the present invention increase speed, sometimes at the expense of circuit area.

3. For encoding, the disparity at the front of any vector is determined by a starting reference and the odd or even number of unbalanced vectors between the current location and the reference or on the odd or even number of balanced vectors. An alternative approach depends on the propagation of the disparity from vector to vector and from byte to byte, which requires more time.

4. For decoding, the current disparity is assumed to be equal to the exit disparity of the next previous disparity dependent byte. In other words, the current disparity at the front and end of a byte is defined as the exit disparity of the previous disparity dependent byte.

5. Also for encoding and decoding, rather than computing the ending disparity of a byte or block and then passing it on to the next block as a starting disparity, the starting disparity of the current byte or block may be computed based on the disparity at a reference point in the preceding block and the disparity characteristics of the bytes in between.

6. Particular attention has been devoted to the critical paths for the S-Function, defined in more detail below, and the complement functions. Broadly, the S-Function is used to avoid false commas. Some serial gating and large fan-in in the critical path has been avoided by gating upstream in multiple non-critical paths.

7. The first logic implementation choice throughout is NAND gates because these have low delay, second choice is NOR-gates. For the same reason, XNOR gates are preferred over XOR gates. Logic polarities are created or modified to make the best use of the preferred circuits.

8. The more critical signals have been wired to the A-inputs, which are the top inputs of the symbols, except for some XOR and XNOR gates for which the bottom inputs have less delay.

9. Designs of the present invention have less sharing of basic logic elements and intermediate functions if these require serial steps. For instance at the input, the A≠B function is generated directly from the A and B inputs instead of from intermediate logic expressions with multiple uses.

It is beneficial, before proceeding with additional details of the present invention, to discuss notation. The signal names used in the equations of this document do not reflect any logic levels. Consequently, they are to be interpreted as abstract logic statements. However, in the circuit diagrams, the signal names may be prefixed with the letter P or N to indicate whether the function is true at the upper or lower level, respectively. The P and N prefixes are normally not used for net names which start with P and N, respectively, unless it could cause confusion and misinterpretations (e.g., NNDFS6=PPDFS6 is not reduced to avoid apparent contradictions such as NDFS6=PDFS6). Net numbers starting with n or m are true at the lower level and take the P prefix if true at the upper level.

For ease of reference, the detailed description is divided into two sections, (I) 8B/10B Encoder and (II) 10B/8B Decoder, each of which has multiple subsections.

I. 8B/10B Encoder

Coding classes have been developed to speed encoding for both 5B/6B and 3B/4B transmission codes. While the old classifications (e.g., such as used in U.S. Pat. No. 4,486,739) relied heavily on 4-variable functions, the new classifications rely more on 3-variable functions, which can be implemented with less delay, and separate functions have been defined that address specifically the disparity aspects of the 3B/4B and 5B/6B codes.

FIG. 1 shows a table used for encoding 5B/6B source vectors. As shown in FIG. 1, the column "Coding Class" has been added to more effectively divide the source vectors into classes. These classes speed coding and are developed as described below. Notation will now be described prior to further analysis of FIG. 1. The 5B/6B vector sets L03 and L30 include all five-bit source vectors (S5) with three logical zeros or ones, respectively, in the bits A, B, and C. In other words, the notation "L03" means that there are no ones and three zeros in the first three bits A, B, and C. Note that the data values are "backwards" from how they are normally written: a "one" is 10000 instead of 00001. However, this is simply a convenience and other representations may be used. The symbols L12 and L21 indicate one logical one and two logical zeros or vice versa, respectively, in the same bits. The new symbols are formally defined as follows. In the logic equations that follow, the symbols ($\cdot$) and (+) represent the Boolean AND and OR functions, respectively. An apostrophe (') represents negation.

The vector sets L03 and L30 comprise all S5 vectors which have three zeros or three ones, respectively, in the bits ABC:

$L03 = A' \cdot B' \cdot C'$ $L30 = A \cdot B \cdot C$

The vector sets L12 and L21 comprise all S5 vectors which have one one and two zeros or two ones and one zero, respectively, in the bits ABC:

$L12 = A \cdot B' \cdot C' + A' \cdot B \cdot C' + A' \cdot B' \cdot C$ $L21 = A' \cdot B \cdot C + A \cdot B' \cdot C + A \cdot B \cdot C'$ A. Coder Equations and Tables Conceptually, coding is done in two steps. First, the translation to the primary vectors is made. A second step for the subset of the disparity dependent coded vectors determines whether the alternate, complemented vectors must be used to meet the disparity rules. Disparity dependent vectors have a plus sign or a minus sign in the DR column of the tables. DR is the required entry disparity. For disparity dependent vectors, the required entry disparity indicates whether the primary or alternate coded vector is used. For instance, if the required entry disparity, DR, is "+," then the primary coded vector is used if the entry disparity is positive, and the alternate coded vector is used if the entry disparity is negative. Note that these codes have a running disparity of plus or minus one at vector boundaries, so there should not be a running disparity of zero at a vector boundary. The entry disparity is the running disparity prior to the current source vector that is to be coded. The running disparity is the cumulative sum of bit values in a series of coded vectors.

Generation of Primary Vectors. The logic equations necessary for the translation to the primary vectors can be read directly from the columns 'Coding Class' and 'Primary abcdei' of FIG. 1, or 'Primary fghj' of FIG. 2, respectively. FIG. 2 shows a table used when coding three bit source vectors into four bit coded vectors for a 3B/4B transmission code. In FIG. 1, the letters 'ABCDE' indicate the source vector, and the letters 'abcdei' indicate the coded vector. The 'K' is used to indicate control characters. In FIG. 2, the letters 'FGH' indicate the source vector and the letters 'fghj' indicate the coded vector. Again, the 'K' indicates a control character. Reference should be made to FIGS. 1 and 2 for the following description. In the 'Primary' columns, all plain bits are the same as the corresponding input bit values ABCDE or FGH. The bold bits are forced to the complemented value indicated. The i and j bits are assumed to be normally zero. If there are two classification entries on a single line separated by a comma, the second expression applies to the last bold zero or one in the Primary column.

In FIG. 1, it should be noted that D11, D13, and D14 have S1=1 for L21·PDFS6·D·E' and that D17, D18, and D20 have S2=1 for L12 NDFS6·D'·E. If S1 or S2 is active and the bits F, G, H are all ones, they will be coded as 0111 or 1000, as shown in the table of FIG. 2 on Dx.A7 row. This prevents misaligned comma sequences.

The extracted logic equations from the tables of FIGS. 1 and 2 are listed below and are performed by the circuit of FIG. 3A, described below.

$a = A$ $b = B \cdot (L30 \cdot D)' + L03 \cdot D'$ $c = C + L03 \cdot D' + L03 \cdot D \cdot E = C + L03 \cdot (D' + D \cdot E) = C + L03 \cdot (D' + E)$ $d = D \cdot (L30 \cdot D)'$ $e = E \cdot (L03 \cdot D)' + L12 \cdot D' \cdot E' + L03 \cdot D \cdot E'$ $i = L21 \cdot D' \cdot E' + L12[(D \neq E) + K] + L03 \cdot D' \cdot E + L30 \cdot D \cdot E$ $f = F \cdot [F \cdot G \cdot H \cdot (S+K)]'$ $g = G + F' \cdot G' \cdot H' = G + F' \cdot H'$ $h = H$ $j = (F \neq G) \cdot H' + F \cdot G \cdot H \cdot (S+K)$ B. Implementation of 8B/10B Bit Encoding An implementation according to the above tables, equations and design principles is illustrated in the circuit diagram 8B/10B Bit Encoding, FIG. 3A. Notation for net names in the encoding circuit diagrams is as follows. The letters 'a' and 'o' within net names refer to the Boolean AND and OR functions, respectively. The letter 'n' within a name negates the preceding parameter. The letters 'e' and 'ue' represent the symbols '=' and '≠', respectively. The capital letters ABCDEFGHK represent the uncoded input bits and the lower case letters abcdeifghj represent the coded format.

FIGS. 3A and 3B represent a single circuit and are shown in two separate figures for convenience only. The inputs and outputs for the total circuit are accompanied by a port symbol, as shown for PA at the upper left and PCa at the upper right of FIG. 3A. If the symbol is not present, as is the case for the signal NCMPLS6 at the upper right side of FIG. 3A, the signal is a wire name and its origin is a wire with exactly the same name in either of the two figures. For instance, NCMPLS6 it is a gate output on the upper right side of FIG. 3B and is used in FIG. 3A on the upper right side. Note that FIG. 3B shows no input port symbols, the signals come all directly from FIG. 3A.

Figure 17:
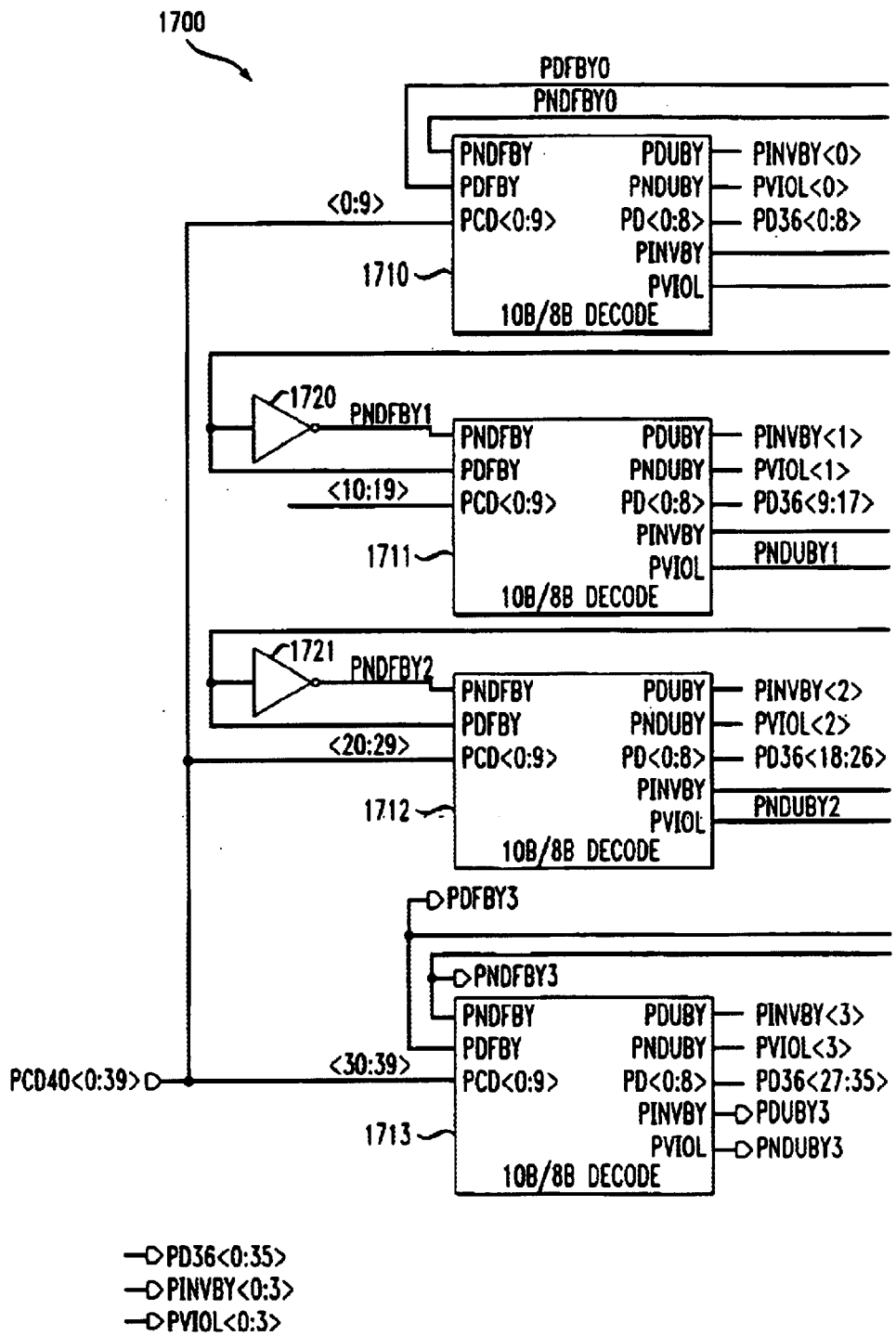
FIG. 17 illustrates an exemplary circuit for performing four parallel decoding operations when decoding an 8B/10B transmission code, in accordance with one embodiment of the present invention.
Figure 17:
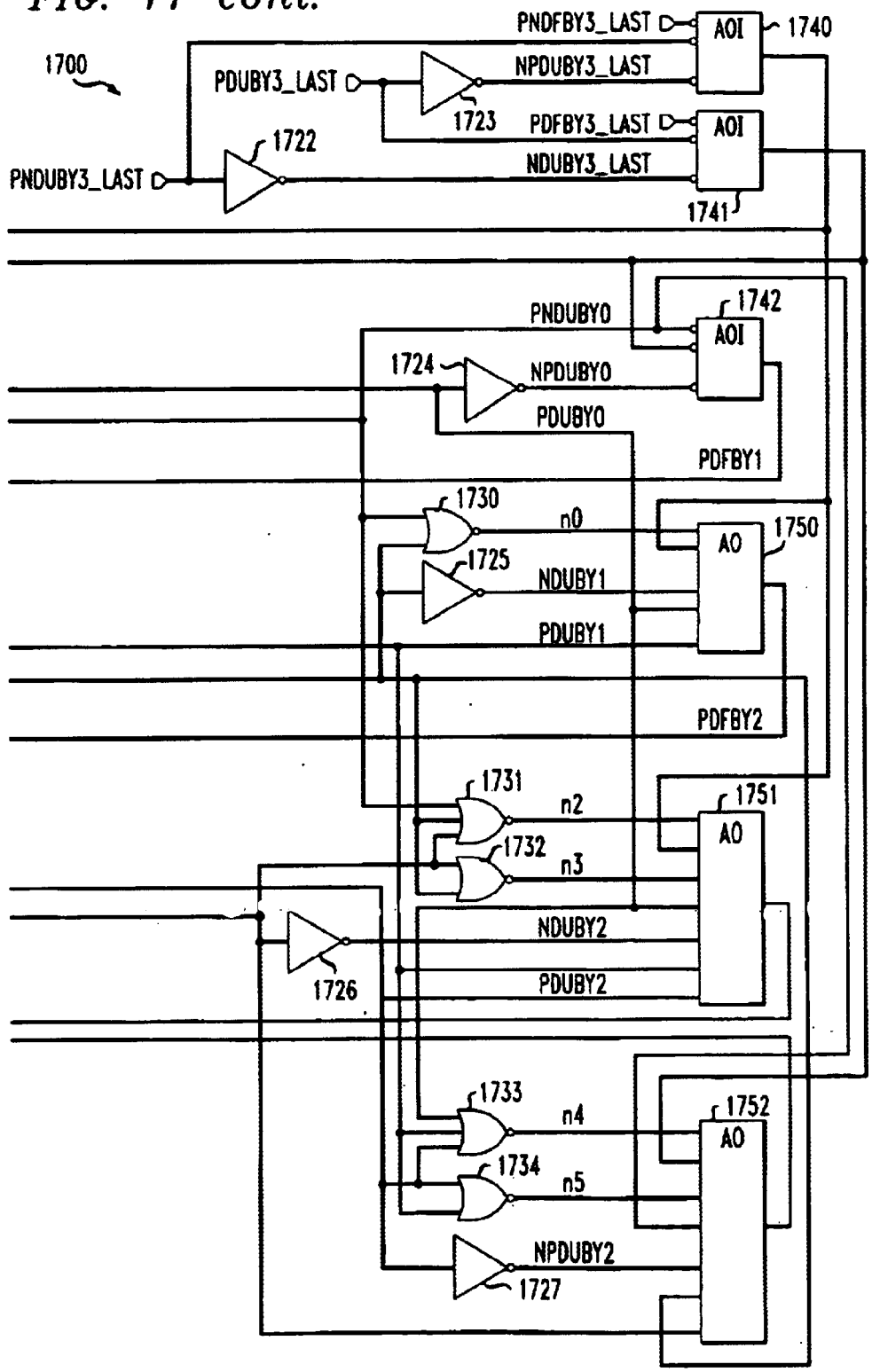

FIG. 3A shows an encoding circuit 300A used for encoding for both 5B/6B and 3B/4B transmission codes. Encoding circuit 300A comprises inverters 301A through 311A, NAND gates 315A through 339A, NOR gates 345A through 354A, an ANDN1 (an AND gate with a single inverting input) 375A, XNOR gates 355A through 359A, XOR gates 365A through 370A, an AND-OR (AO) block 385A, and AND-OR-INVERT (AOI) blocks 380A and 381A. AOI block 380A is discussed below in reference to FIG. 4. It should be noted that FIG. 3A and subsequent figures use multiple symbols for the same device. For instance; element 323A is a NAND gate that is shown as an OR gate with inverted inputs and output. These two gates are functionally equivalent. Similarly, the element 351A is functionally equivalent to a NOR gate, and the element 1740 of FIG. 17 is functionally equivalent to an OAI block.

Due to space restrictions, the following shorthand is used in FIG. 3A: n0=NABnCn; n1=NAnBCn; n2=NAnBnC; n3=NABCn; n4=NABnC; n5=NAnBC; n6=NELO3noDn; n8=NL12NDFS6DnEFGH; n9=NL21PDFS6DEnFGH; and n10=PHnFueG.

The signal NCMPLS6 comes from the disparity control circuit shown in FIG. 3B below. This signal is used to invert the primary coded vector abcdei to create the alternate coded vector (abcdei)'. This inversion is performed according to disparity rules. Similarly, the signal NCMPLS4 comes from the disparity control circuit shown in FIG. 3B below, and this signal is used to invert the primary coded vector fghj to create the alternate coded vector (fghj)' according to disparity rules.

Figure 4:
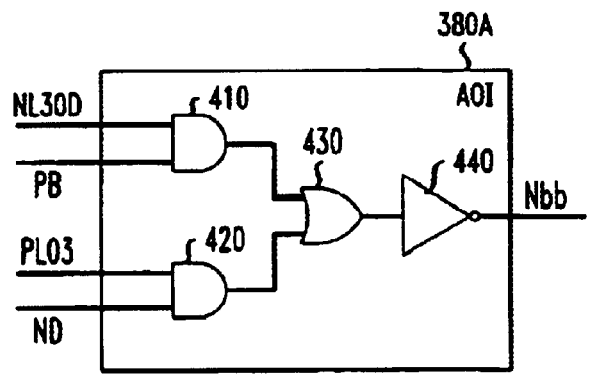
FIG. 4 illustrates an AND-OR-INVERT logic symbol used in the encoding circuit of FIG. 3A, in accordance with one embodiment of the present invention.

The signal PNDFS6 is a signal that is used during disparity determinations and is described in more detail in reference to FIGS. 5 through 8. This signal is also a component of the S-Function. Referring now to FIG. 4, AOI block 380A is shown. AOI block 380A comprises two AND gates 410 and 420, an OR gate 430 and an inverter 440. In this particular example, Nbb will be a low level when either NL30D and PB are high levels or when PL03 and ND are high levels. In this example of an AOI block, there are four inputs. Other AOI blocks are used in the figures discussed below. If there are additional inputs, there will generally be one AND gate for each group of inputs. However, some AOI blocks have a single input that is not part of a group. For these blocks, the single input generally goes directly to an OR gate, such as OR gate 430, without passing through an AND gate. An AO block, such as AO block 385A of FIG. 3A, will not have the inverter 440. In an OA block, used in a figure below, there is one AND and multiple ORs, where the ORs are connected to the inputs and the AND is connected to the output. For instance, a four-input OA block would have ORs in place of ANDs 410, 420, an AND in place of OR 430, and no inverter 440.

C. 8B/10B Disparity Control

The column 'DR Class' in the tables in FIGS. 1 and 2 classifies the vectors according to the plus sign and the minus sign entries in the DR column, which indicate the required disparity at the front of the primary coded vector. The expressions PDRS6, PDRS4 and NDRS6, NDRS4 represent a positive or negative required disparity, respectively, at the start of the 6B or 4B vectors, and these expressions are described in more detail below.

PDRS6. The set of 6B vectors with a plus sign in the DR column is referred to as PDRS6.

$$PDRS6=L03\cdot(D+E')+L30\cdot D\cdot E'+L12\cdot D'\cdot E'$$

NDRS6. The set of 6B vectors with a minus sign in the DR column is referred to as NDRS6.

$$NDRS6=L30\cdot(D'+E)+L03\cdot D'\cdot E+L21\cdot D\cdot E+K$$

PDRS4.

$$PDRS4=F'\cdot G'+(F\neq G)\cdot K$$

NDRS4.

$$NDRS4=F\cdot G$$

In the circuit diagrams, the signal names PDFS6, PDFS4 and NDFS6 and NDFS4 represent the actual running disparity at the front of the 6B and 4B vectors, respectively.

If the polarities of DF and DR do not match, a complement signal is generated which selects the alternate vector. As an example, if PDFS6 and NDRS6 are both true, complementation is performed.

$$CMPLS6=NDFS6\cdot PDRS6+PDFS6\cdot NDRS6$$

$$CMPLS4=NDFS4\cdot PDRS4+PDFS4\cdot NDRS4$$

The column 'DB Class' (Block Disparity) identifies all coded vectors which are balanced as identified by a zero in the DB column.

BALS6. The set of 6B vectors with a zero in the DB column is referred to as BALS6.

$$BALS6=L21\cdot(D'+E')+L12\cdot K'\cdot(C+E)+L30\cdot D'\cdot E'$$

BALS4. The set of 4B vectors with a zero in the DB column is referred to as BALS4.

$$BALS4=(F\neq G)+F\cdot G\cdot H'$$

Additional circuits governed by the signals BALS6 and BALS4 indicate the balance of a byte by the signal PBALBY which assumes the upper level for a balanced byte.

The above expressions are carried out by the disparity control circuit 300B of FIG. 3B. Disparity control circuit 300B comprises inverters 301B and 302B, NAND gate 310B, NOR gates 320B through 331B, XOR gate 340B, AO blocks 350B through 353B, AOI blocks 360B and 361B, and OA block 370B.

A reduction in the combined delay of a 5B/6B and a 3B/4B encoder, or of several 8B/10B encoders operating in parallel, results from the methodology used to determine the disparity at any vector boundary. This is shown at the bottom of circuit diagram of FIG. 3B and on the diagram shown in FIG. 5 (discussed in further detail below). Given a starting disparity such as NDFBY (Negative Disparity in Front of a Byte), the running disparity at any subsequent vector boundary remains unchanged if the combined number of balanced S6 and S4 vectors between the two points is even, otherwise it assumes the complementary polarity. This is in contrast to the more conventional techniques which observe the disparity as it propagates from vector to vector. The expression NDFS4 represents a negative running disparity in front of the 4B vector.

The 8B/10B encoder, which comprises the circuit 300A of FIG. 3A and the circuit 300B of FIG. 3B, has an output which indicates whether the coded 10-bit byte is balanced or not (i.e., PBALBY), but there is no output to indicate the ending disparity. Generally, the starting disparity for a vector is determined from the disparity of a prior reference point and the odd or even number of balanced vectors in between.

D. Disparity Circuit for 1-Byte Encoder, Fast Version

This circuit takes advantage of the fact that it is not necessary that the starting disparity be known immediately for the encoding process. Since the evaluation of the running disparity at the end of a byte may be in the critical delay path, the final operations for determining the starting disparity, PNDFS6, of the next byte are deferred to the next byte interval to be executed while initial bit encoding, independent of the running disparity, is performed. The cost of doing this is to pass along two parameters rather than just one to the next byte interval for an increase the timing margin by an amount equal to the delay of an XNOR2 gate, where the "2" stands for a 2-input gate.

Figure 5:
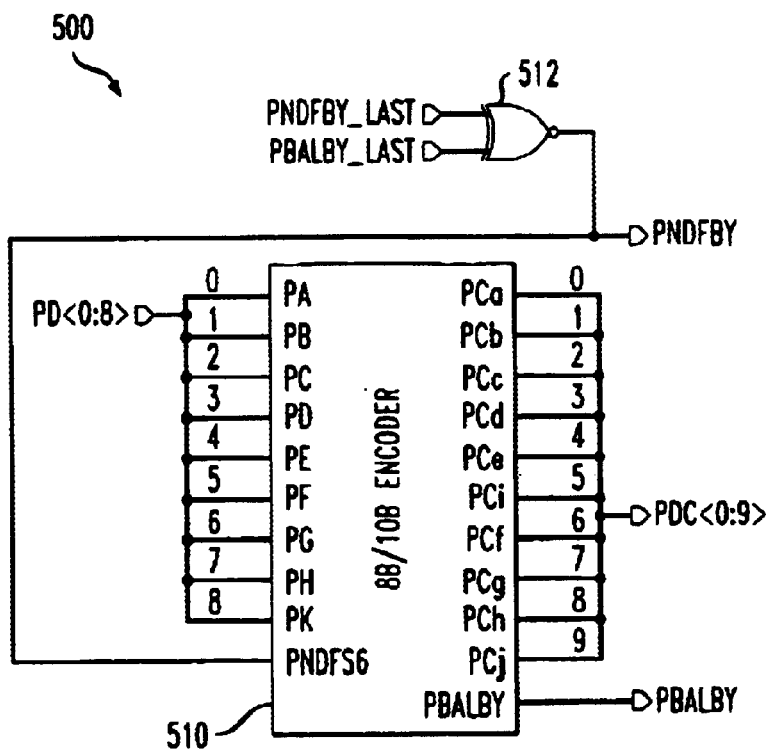
FIG. 5 illustrates a relatively fast version of an exemplary circuit for disparity determination for a one byte encoder in accordance with one embodiment of the present invention.

FIG. 5 shows a disparity circuit 500 that provides the starting disparity NDFBY and a coded byte disparity 'PBALBY' for the current byte based on these identical two parameters carried over from the preceding byte. Circuit 500 comprises an 8B/10B encoder 510, and an XNOR gate 512. 8B/10B encoder 510 comprises circuits 300A and 300B. At the end of each byte cycle, the signals PNDFBY and PBALBY are stored in two latches (not shown) with outputs PNDFBY_LAST and PBALBY_LAST, respectively. The respective latches are not shown since their timing is identical to or closely related to the timing for the data output latches (also not shown). These parameters are used for the computation of the starting disparity of the next byte. The signal PNDFBY is at the upper level for a negative running disparity in front of the new byte.

There are two coded vectors (6B, 4B) per byte of source data. So if there is an odd number of balanced or unbalanced vectors between the start of the current byte and a previous byte boundary, the starting disparity for the current byte is the complement of the disparity at the reference point; otherwise, it is the same.

One reason that the disparity circuit 500 is fast is as follows. Because the previous staring disparity PNDFBY_LAST and the previous coded byte disparity PBALBY_LAST are known, then PNDFS6 can be determined after a short delay, the delay of one XNOR gate 512. As can be seen in FIG. 3B, the PNDFS6 is an input to the disparity control circuit 300B. The disparity control circuit 300B can then use the PNDFS6 signal after only a short delay, and the disparity control circuit 300B then produces the signals NCMPLS6 and NCMPLS4, signals which are used by the encoding circuit 300A of FIG. 3A to invert, if necessary, the six-bit and four-bit, respectively, coded vectors. By the time the six-bit coded vector PCa, PCb, PDc, PCd, PCe, and PCi has been coded, the signal NCMPLS6 should be available, which means that the encoding of a byte of an 8B/10B transmission code can take place in one cycle.

E. Disparity Circuit for 1-Byte Encoder, Slower Version

Figure 6:
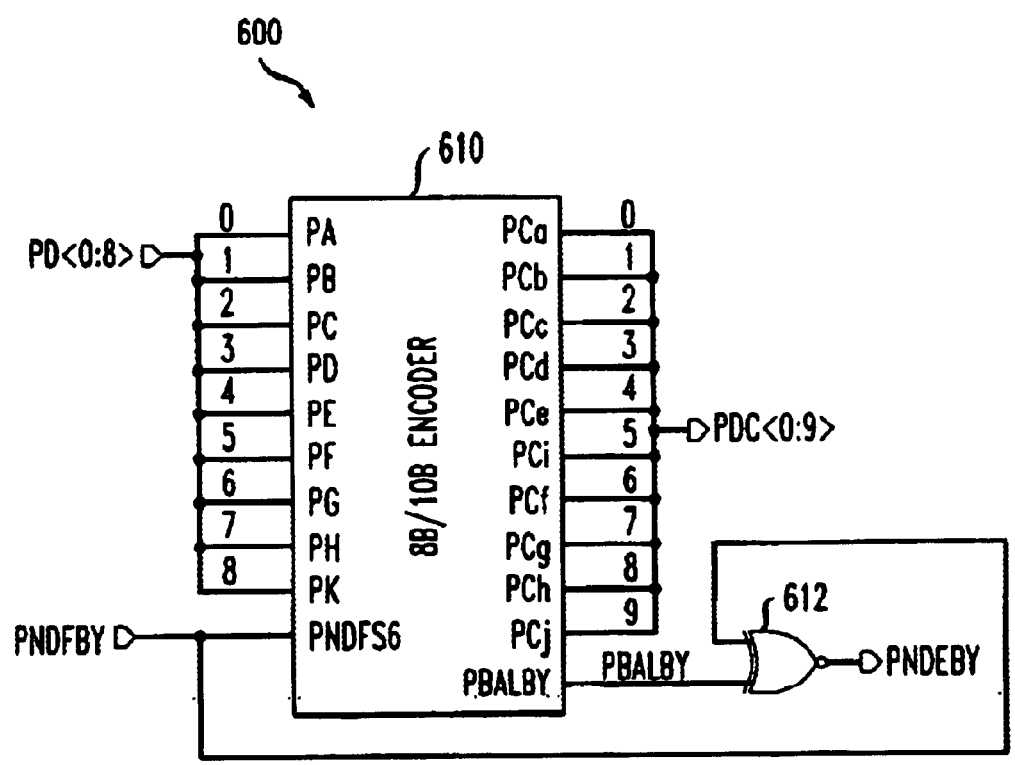
FIG. 6 illustrates a relatively slow version of an exemplary circuit for disparity determination for a one byte encoder in accordance with one embodiment of the present invention.

To better illustrate the fast approach to disparity operations, a more traditional way is also shown in FIG. 6 and is applicable where the higher performance of circuit 500 of FIG. 5 is not needed. FIG. 6 shows a disparity circuit 600 comprising an 8B/10B encoder 610 and an XNOR gate 612. Encoder 610 is basically equivalent to encoder 510, although the timing involved with encoder 610 will be different than that involved with encoder 510. In traditional circuits, the ending disparity PNDEBY is derived within one and the same encoding cycle. Then only one parameter must be passed on to the next cycle with a single latch. The data input of this latch is PNDEBY and the output is PNDFBY, the disparity at the front of the next byte.

One reason that disparity circuit 600 is slower than disparity circuit 500 is described as follows. For the disparity circuit 600 to determine ending disparity of the current byte, the coded byte disparity for the current byte PBALBY must be known, which means that the cycle for encoder 610 must be finished. Then the ending disparity PNDEBY for the current byte is calculated by XNOR 612 in the same cycle.

While there is a speed improvement of disparity circuit 500 as compared to disparity circuit 600 in a single-byte application, a much greater speed improvement is realized when disparity circuit 500 is used in multiple byte applications where multiple bytes are coded in parallel.

F. Disparity Circuit for Four-Byte Encoder, Faster Version

Figure 7:
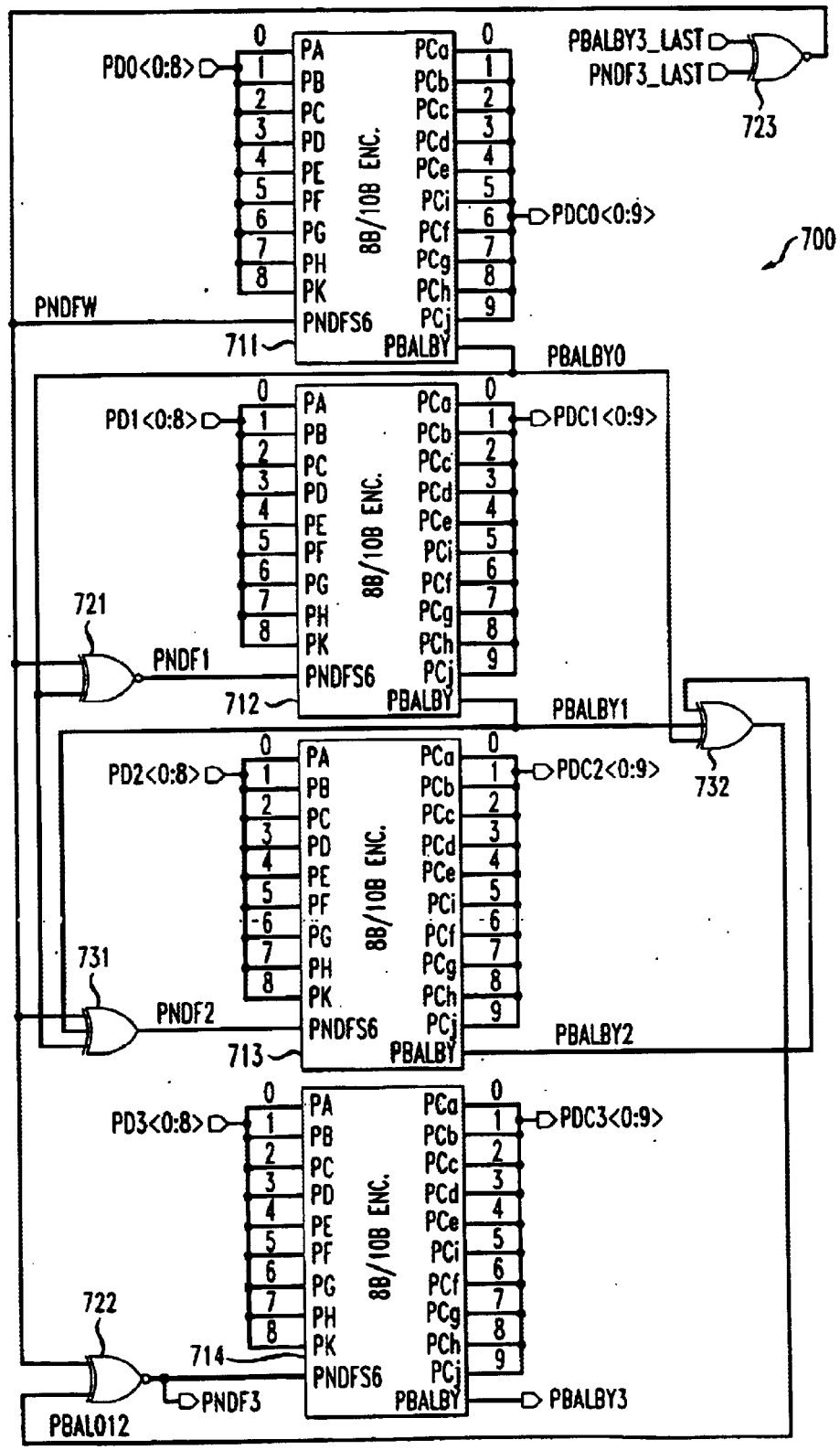
FIG. 7 illustrates a relatively fast version of an exemplary circuit for performing four parallel encoding operations when encoding an 8B/10B transmission code, in accordance with one embodiment of the present invention.

Referring now to FIG. 7, a disparity circuit 700 for a four-byte encoder is shown. This disparity circuit 700 shows four 8B/10B encoders 711, 712, 713, and 714 operating in parallel on a four-byte word (also called "block") PD0, PD1, PD2, and PD3. Additionally, as part of the disparity circuit 700, there are three XNOR gates 721, 722, and 723 and two XOR gates 731 and 732.

Again, this circuit takes advantage of the fact that it is not necessary that the starting disparity be known immediately for the encoding process. For this application, the circuit of FIG. 3B may be modified as follows: the gating by the signals PNDFS6 and PDFS6 may be moved forward in the logic chain. As an example, it might be advantageous, depending on the delay characteristics of the gates and interconnections, to move the respective gating to the AO blocks 350D and 351B or even to the 330B gate, which would then be changed to an AOI gate. The final operations for determining the starting disparity, PNDFW, of the next four-byte block are deferred to the next byte interval. The two parameters PBALBY3_LAST and PNDF3_LAST at the top right of FIG. 7 are carried over from the preceding block interval at the bottom of FIG. 7. The starting disparity of the current block (or the ending disparity of the previous block) is given by the input PNDFW (Negative Disparity in Front of the Word). The starting disparity for each of the remaining three bytes (i.e., PD1, PD2, and PD3) is obtained by circuits operating in parallel from this reference point and the number of balanced bytes in between using the set of XOR and XNOR gates 720 through 724.

The signal PBAL012 is at the upper level if the block comprising the first three bytes (i.e., PD0, PD1, and PD2) is balanced. The ending disparity for the word, PNDEW, is passed along to the next word cycle via a latch (not shown), the output of which is the starting disparity PNDFW for the next cycle. Again, the coding delay can be reduced by the delay of one XNOR gate, if the generation of the PNDEW signal is deferred to the next word cycle as shown in FIG. 5 for the one byte case.

Some designers have implemented daisy chains for disparity propagation from byte to byte with the associated serious delay penalties. For instance, if the disparity circuit 600 of FIG. 6, which uses the ending disparity of the current byte, is used in disparity circuit 700, then the second encoder 712 must wait until PBALBY0 from the first encoder 711 is determined. Similarly, encoder 713 must wait until PBALBY0 from the first encoder 711 and PBALBY1 from the second encoder 712 are determined. This means that each encoder must wait until the previous encoder has completed its cycle before the encoder can finish its encoding cycle. The circuit of FIG. 7 is more parallel in operation and will run at faster speed than conventional designs.

Broadly, what FIG. 7 shows is a block encoder having several parallel 8B/10B encoders and that determines the starting disparity at the front of each of the multiple coded 10-bit bytes based on the running disparity at the front of the block or any other reference point, the number of coded bytes between the reference point and the byte in question and the odd or even number of balanced bytes in the same interval. If the number of bytes in the interval is odd and the number of balanced vectors is also odd, then the running disparity is identical to the disparity at the reference point and otherwise it is the complement.

G. Disparity Circuit for 4-Byte Encoder, Slower Version

Figure 8:
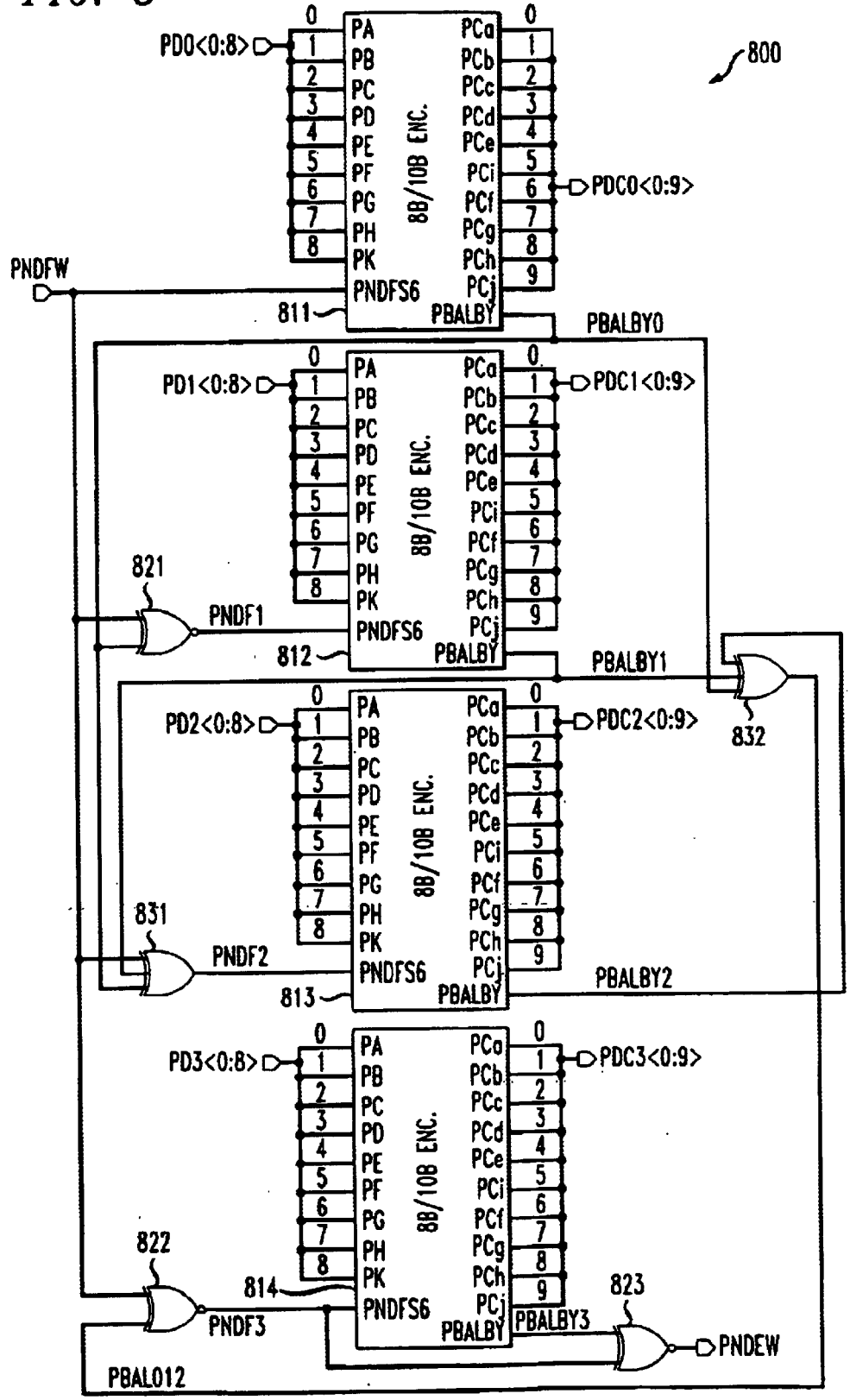
FIG. 8 illustrates a relatively slow version of an exemplary circuit for performing four parallel encoding operations when encoding an 8B/10B transmission code, in accordance with one embodiment of the present invention.

Referring now to FIG. 8, a disparity circuit 800 for a four-byte encoder is shown. This disparity circuit 800 shows four 8B/10B encoders 811, 812, 813, and 814 operating in parallel on a four-byte word PD0, PD1, PD2, and PD3. Additionally, as part of the disparity circuit 800, there are three XNOR gates 821, 822, and 823 and two XOR gates 831 and 832.

As discussed above, in traditional circuits, the ending disparity PNDEW is derived within one and the same encoding cycle. Then only one parameter must be passed on to the next cycle with a single latch. The data input of this latch is PNDEW and the output is PNDFW, the disparity at the front of the next word. Disparity circuit 800 is slower than disparity circuit 700 as described as follows. For the disparity circuit 800 to determine the ending disparity of the current four-byte block, the coded byte disparities PBALBY (0,1,2,3) for the current block must be known, which means that the cycle for encoders 811 through 814 must be finished. Then the ending disparity for the current block PNDEW is calculated by XNOR 823. Exemplary 8B/10B encoders have been described, and corresponding decoders will now be described.

II. 10B/8B Decoder

The decoder comprises circuits to restore the original byte ABCDEFGH K, and circuits to indicate all transmission errors to the extent that they are detectable by the transmission code. The rules for the 6B/5B decoding are listed in the table shown in FIG. 9 and the rules for 4B/3B decoding are listed in the table shown in FIG. 11, to be described below. Some changes in classifications have been made to enable faster operation at the expense of a few extra circuits.

The necessary bit translations for the decoding of a byte have been extracted from the tables shown in FIGS. 9 and 11 and are listed in condensed form in the table shown in FIG. 12. The value of the decoded bits 'ABCDE FGH' is equal to the coded bits 'abcde fgh', respectively, except when the coded bits belong to one of the listed classifications of the table shown in FIG. 12 and there is an 'F' for false in the respective bit column for that class.

The logic implementations of the decoder described in U.S. Pat. No. 4,486,739 (incorporated by reference above) and by Widmer, "The ANSI Fibre Channel Transmission Code," IBM Research Report 18855 (1993), the disclosure of which is hereby incorporated by reference, are attempts to minimize the required circuit area This was accomplished in these references by a reuse of basic logic definitions for various purposes such as decoding and error checking. That approach adds circuit delay and is not optimal for very high speed applications. The high speed implementation described herein uses separate classifications for bit decoding, disparity classifications DR and DU, and each of these sets is implemented for minimum delay in IBM CMOS-7S or other suitable technology.

Some of the 6B vector sets have been defined more broadly in the current design to allow invalid vectors in the sets, which leads to simpler logic terms with less delay. An invalid vector can be created because there are 48 6B/5B coded vectors but six bits can hold a maximum of 64 different vectors. An error that occurs during transmission, for instance, can cause an invalid coded vector. The new definitions operate-identically for valid inputs, but for invalid inputs there may be different results, which should be taken into account in the logic modeling and verification. These more inclusive categories also reduce the delay in the critical path of the disparity rule checks because the invalid coded vectors do not have to be added explicitly. There is a double win in using more comprehensive classifications: Simpler implementation and fewer logic terms result. Note that even though invalid bytes may be decoded into a valid byte, they will still be marked by a special signal line (i.e., PINVBY) used to determine an invalid byte.

The vector sets P3x and Px3 comprise all four-bit vectors 'abcd' with three or four ones and three or four zeros, respectively, and replace the old sets of P13, P31. The sets P22, P04, and P40 are used only in the error checking circuits where P22 is derived from Px3 and P3x. The following are equations determined through reference to FIGS. 9 and 11 and implemented by the decoding circuit described in FIGS. 10A and 10B below.

$$P40 = a \cdot b \cdot c \cdot d$$

$$P04 = a' \cdot b' \cdot c' \cdot d'$$

$$P3x = P31 + P40 = a \cdot b \cdot c + a \cdot b \cdot d + a \cdot c \cdot d + b \cdot c \cdot d$$

$$Px3 = P13 + P04 = a' \cdot b' \cdot c' + a' \cdot b' \cdot d' + a' \cdot c' \cdot d' + b' \cdot c' \cdot d'$$

$$P22 = P3x' \cdot Px3'$$

The vector sets P2x and Px2 are used to define the disparity classes and comprise all 3-bit vectors 'abc' with two or three ones and two or three zeros, respectively:

$$P2x = P21 + P30 = a \cdot b + a \cdot c + b \cdot c$$

$$Px2 = P12 + P03 = a' \cdot b' + a' \cdot c' + b' \cdot c'$$

The 6B/5B decoding table shown in FIG. 9 and the 4B/3B decoding table shown in FIG. 11 have been modified to reflect these changes. Note that, in FIGS. 9 and 11, K=(K28+Kx.7)=(c=d=e=i)+(e≠i)·(i=g=h=j).

A. 6B/5B Decoder, Validity Checks

Logic Equations for the generation of the decoded bits A, B, C, D, E are determined as follows. Generally, A=a, B=b, C=c, D=d, E=e, except for the conditions listed in the table shown in FIG. 12 (as indicated by an "F"), where the complement of the respective coded bit is generated, e.g. A=a'.

Figure 10A:
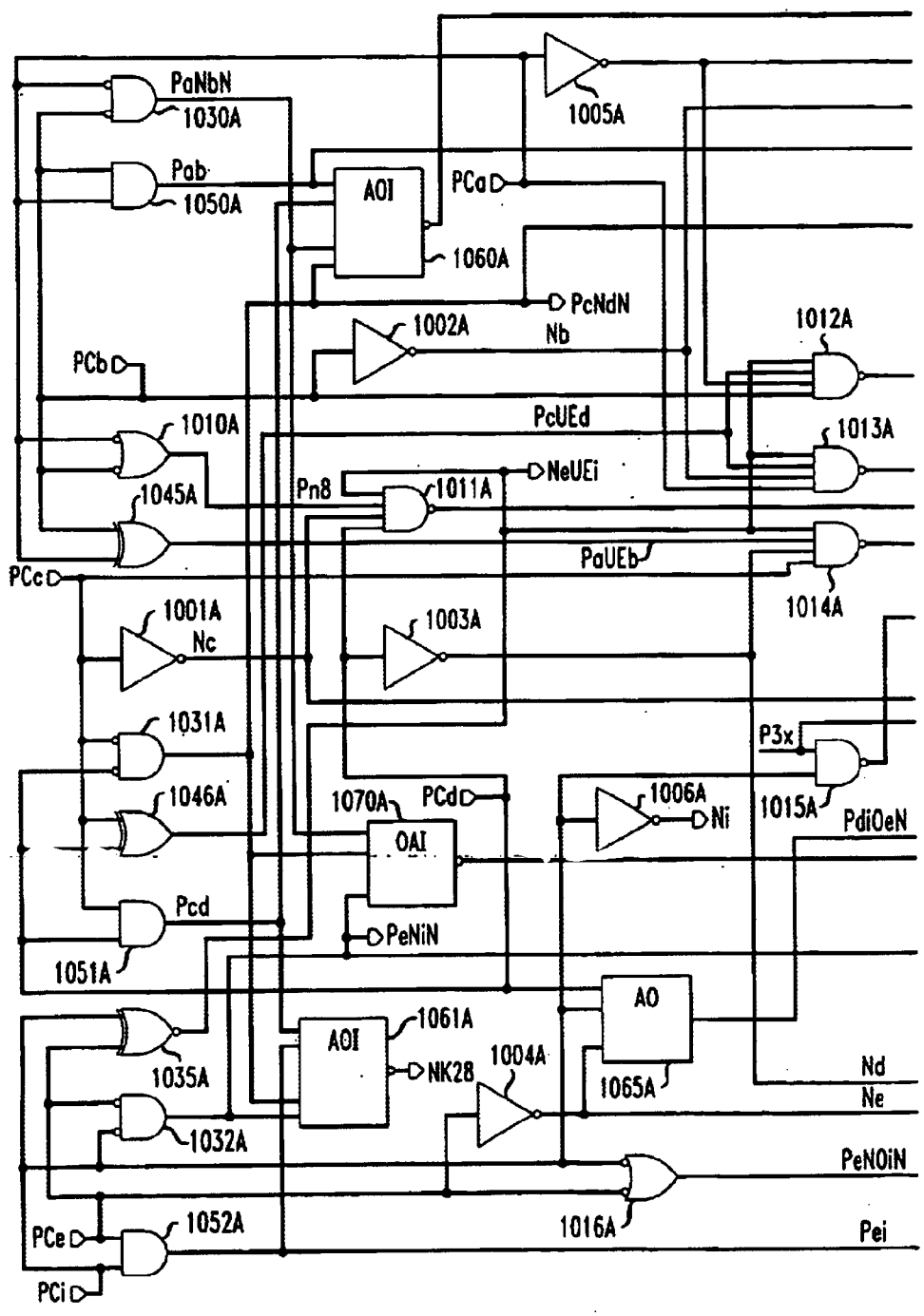
FIG. 10A illustrates an exemplary circuit for performing 6B/5B decoding and validity checks when decoding a 6B/5B portion of a 10B/8B transmission code, in accordance with one embodiment of the present invention.
Figure 10A:
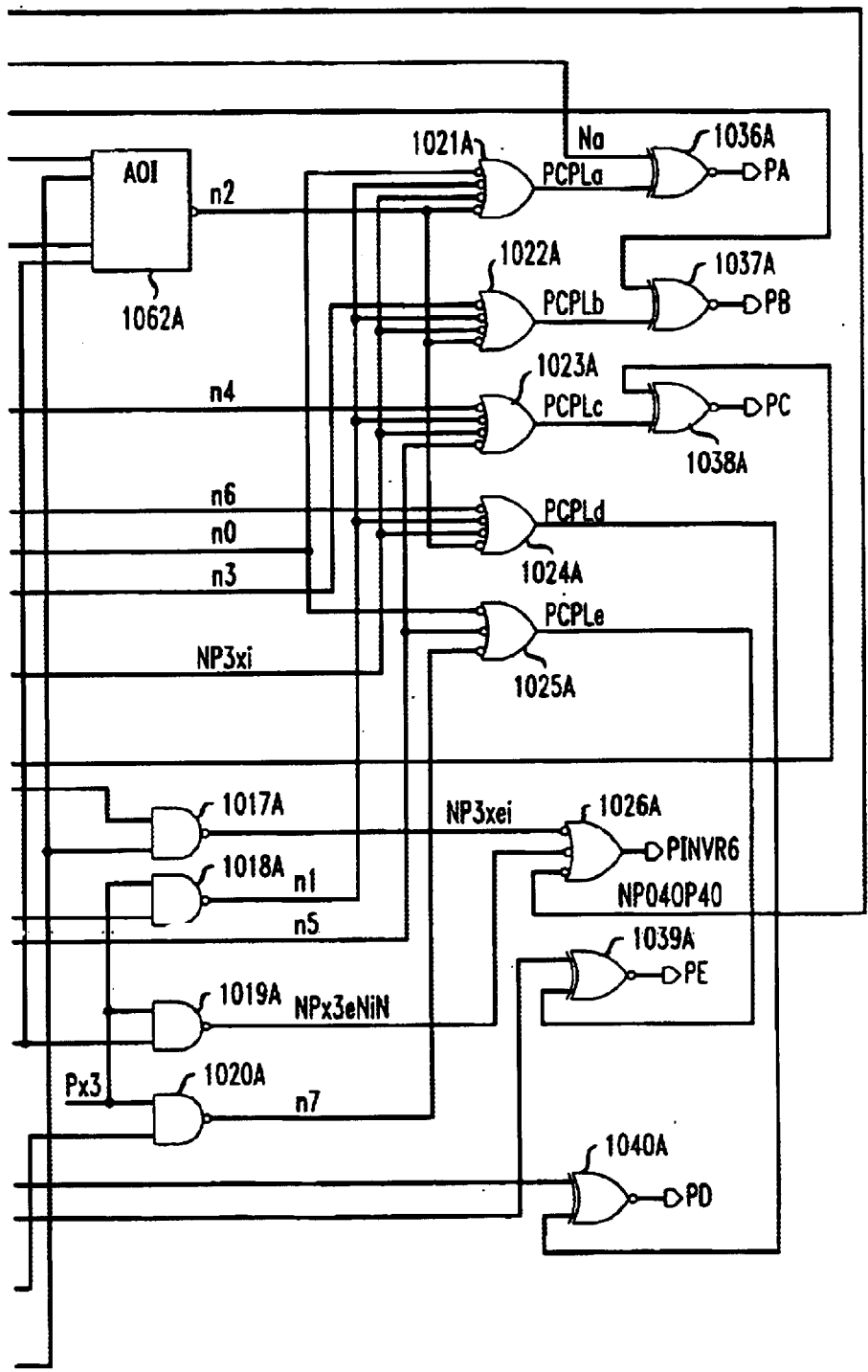
Figure 10B:
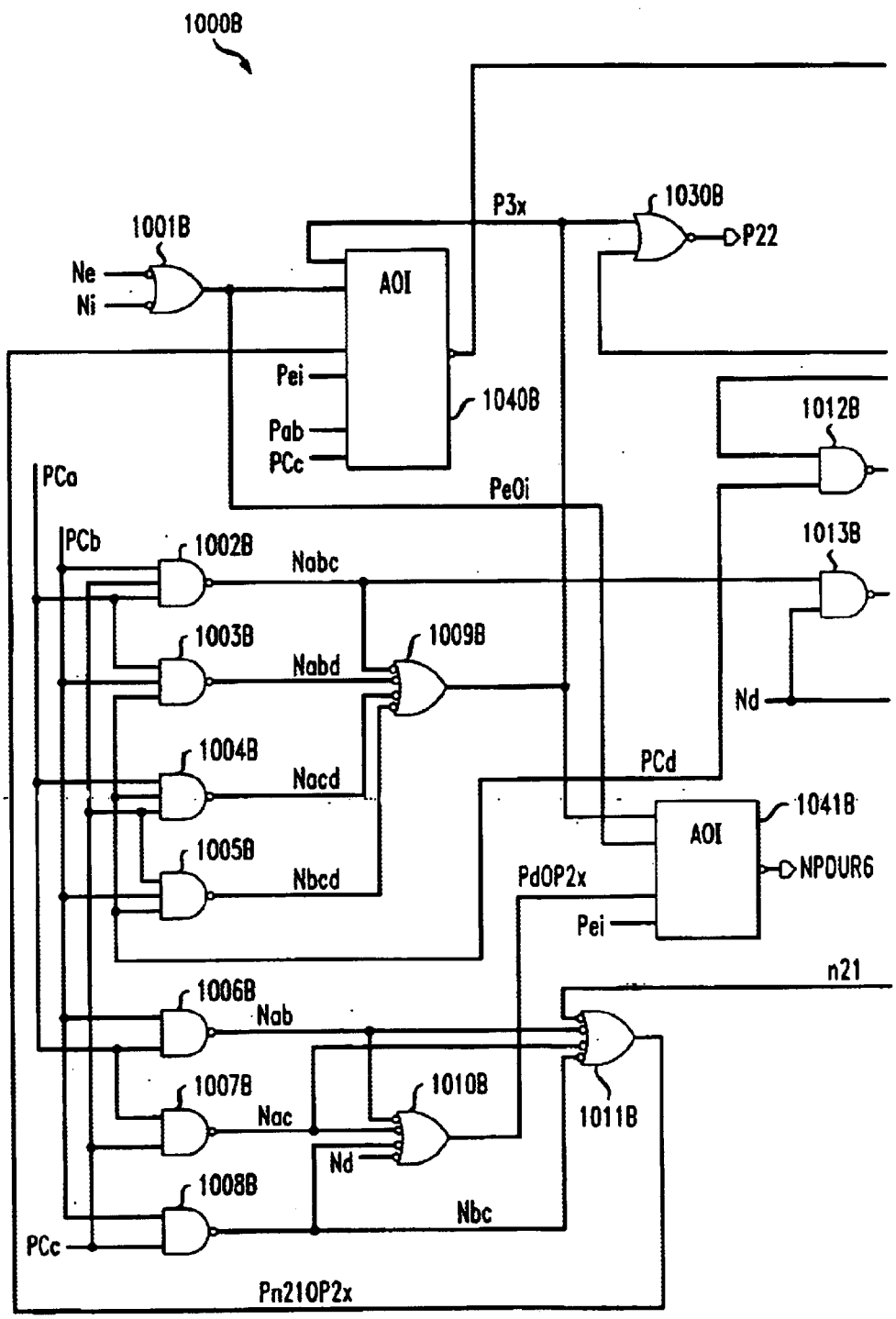
FIG. 10B illustrates an exemplary circuit for performing disparity checks when decoding a 6B/5B portion of a 10B/8B transmission code, in accordance with one embodiment of the present invention.
Figure 10B:
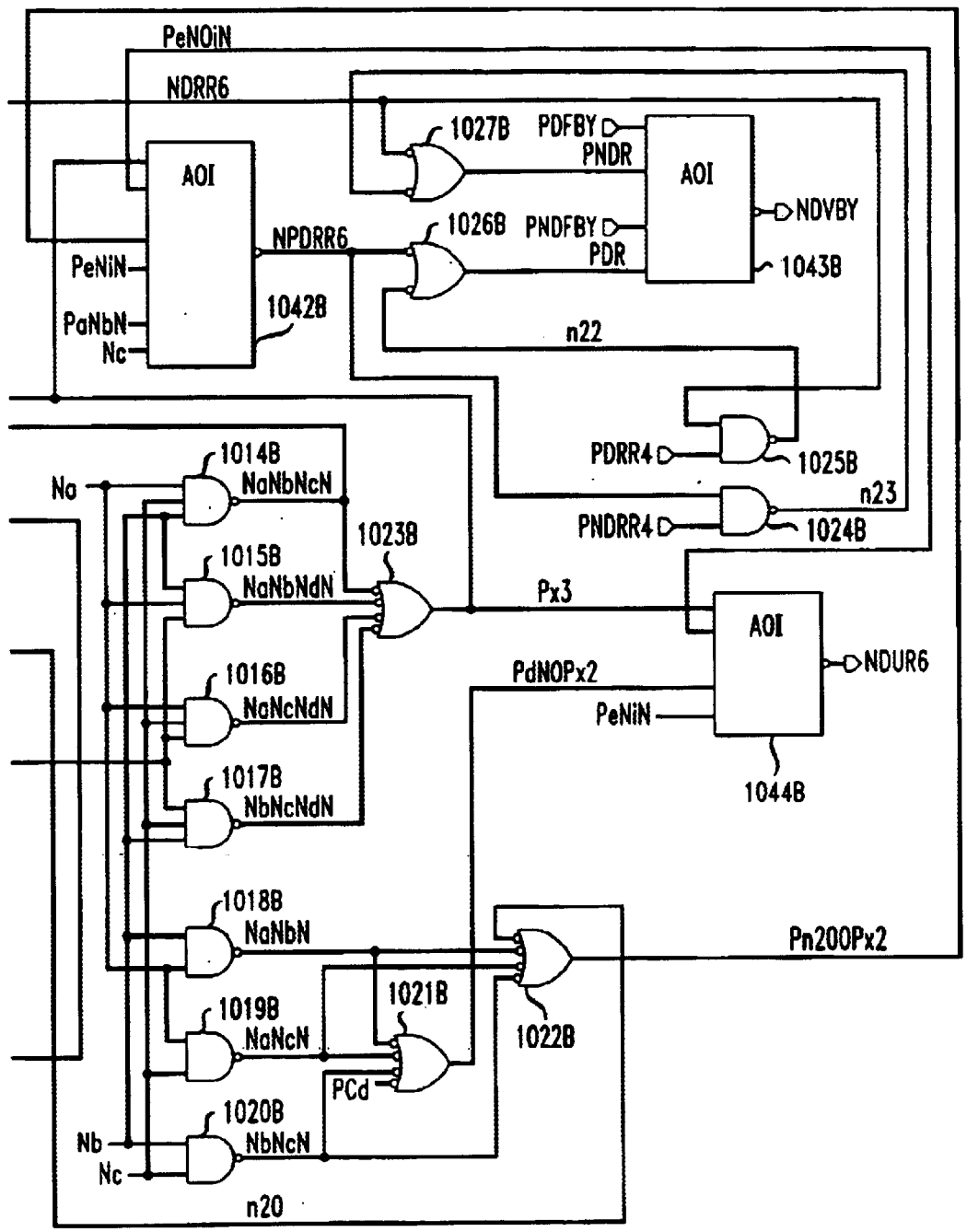

FIGS. 10A and 10B represent a single circuit and the explanations with regard to inputs and outputs and shared wire names given for FIGS. 3A and 3B apply here as well.

Turning now to FIG. 10A, a decoding and validity checking circuit 1000A is shown. Decoding and validity checking circuit 1000A comprises inverters 1001A through 1006A, NAND gates 1010A through 1026A, NOR gates 1030A through 1032A, AND gates 1050A through 1052A, XNOR gates 1035A through 1040A, XOR gates 1045A and 1046A, AO block 1065A, AOI blocks 1060A through 1062A, and OAI block 1070A The following decoding equations are extracted from the table shown in FIG. 12 and are implemented by the circuit shown in FIG. 10A.

1. A=a'iff (if and only if):

$$a \cdot b' \cdot c' \cdot d \cdot (e=i) + P3x \cdot i + a' \cdot b \cdot c' \cdot d \cdot (e=i) + a \cdot b \cdot e \cdot i + Px3 \cdot (d \cdot i + e') + c' \cdot d' \cdot e' \cdot i'$$

Using Boolean manipulations, this logic statement can be restructured as follows:

$$(a \ne b) \cdot c' \cdot d \cdot (e=i) + P3x \cdot i + Px3 \cdot (d \cdot i + e') + a \cdot b \cdot e \cdot i + c' \cdot d' \cdot e' \cdot i'$$

An examination of the table shown in FIG. 9 shows that the first term in the above equation [(a≠b)·c'·d·(e=i)] can be changed to (a'+b')·c'·d·(e=i). This modified expression overlaps with D7 ('1000111'=Px3·d·i) which also requires complementation of the bit 'a'. So it is possible to eliminate the term Px3·d·i for the decoding of bit 'a=0' to 'A=1' and thus reduce the delay in a non-critical path, but the example here has included it because it saves a gate. The equation implemented in circuit diagram of FIG. 10A is:

$$(a'+b') \cdot c' \cdot d \cdot (e=i) + P3x \cdot i + Px3 \cdot (d \cdot i + e') + a \cdot b \cdot e \cdot i + c' \cdot d' \cdot e' \cdot i'$$

In said logic diagram of FIG. 1A, the following abbreviations are used:

$$n0 = (a'+b') \cdot c' \cdot d \cdot (e=i) = c' \cdot d \cdot (e=i) \cdot n8$$

$$n1 = Px3 \cdot (d \cdot i + e')$$

$$n2 = a \cdot b \cdot e \cdot i + c' \cdot d' \cdot e' \cdot i'$$

$$n8 = (a'+b')$$

CPLa=n0+n1+P3x·i+n2, where CPL suggests complementation

2. B=b'iff:

$$a' \cdot b \cdot c \cdot d' \cdot (e=i) + P3x \cdot i + a \cdot b' \cdot c \cdot d' \cdot (e=i) + a \cdot b \cdot e \cdot i + Px3 \cdot (d \cdot i + e') + c' \cdot d' \cdot e' \cdot i'$$

Boolean reduction gives:

$$(a \ne b) \cdot c \cdot d' \cdot (e=i) + P3x \cdot i + Px3 \cdot (d \cdot i + e') + a \cdot b \cdot e \cdot i + c' \cdot d' \cdot e' \cdot i'$$

By examination of the table shown in FIG. 9, it can be verified that the first term (a≠b)·c·d'·(e=i) can again be simplified to (a+b)·c·d'·(e=i). However, it turns out that (a≠b) can be generated with less delay than (a+b), and so the former expression is used.

In the logic diagram, the following abbreviations are used:

$$n3 = c \cdot d' \cdot (e=i) \cdot (a \ne b)$$

$$CPLb = n3 + n1 + P3x \cdot i + n2$$

3. C=c'iff:

$$a' \cdot b \cdot c \cdot d' \cdot (e=i) + P3x \cdot i + a' \cdot b \cdot c' \cdot d \cdot (e=i) + a' \cdot b' \cdot e' \cdot i' + Px3 \cdot (d \cdot i + e') + c' \cdot d' \cdot e' \cdot i'$$

This logic statement can be restructured as follows:

$$a' \cdot b \cdot (c \ne d) \cdot (e=i) + P3x \cdot i + Px3 \cdot (d \cdot i + e') + e' \cdot i' (a' \cdot b' + c' \cdot d')$$

In the logic diagram, the following abbreviations are used:

$$n4 = a' \cdot b \cdot (c \ne d) \cdot (e=i)$$

$$n5 = e' \cdot i' \cdot (a' \cdot b' + c' \cdot d')$$

$$CPLC = n4 + n1 + P3x \cdot i + n5$$

4. D=d'iff:

$$a \cdot b' \cdot c' \cdot d \cdot (e=i) + P3x \cdot i + a \cdot b' \cdot c \cdot d' \cdot (e=i) + a \cdot b \cdot e \cdot i + Px3 \cdot (d \cdot i + e') + c' \cdot d' \cdot e' \cdot i'$$

This logic statement can be restructured as follows:

$$a \cdot b' \cdot (c \neq d) \cdot (e=i) + P3x \cdot i + a \cdot b \cdot e \cdot i + Px3 \cdot (d \cdot i + e') + c' \cdot d' \cdot e' \cdot i'$$

In the logic diagram, the following abbreviations are used:

$$n6 = a \cdot b' \cdot (c \neq d) \cdot (e=i)$$

$$CPLd = n6 + n1 + P3x \cdot i + n2$$

5. E=e'iff:

$$a \cdot b' \cdot c' \cdot d \cdot (e=i) + Px3 \cdot i' + a' \cdot b \cdot c' \cdot d \cdot (e=i) + a' \cdot b' \cdot e' \cdot i' + Px3 \cdot (d \cdot i + e') + c' \cdot d' \cdot e' \cdot i'$$

Boolean reduction reduces this to:

$$(a \neq b) \cdot c' \cdot d \cdot (e=i) + Px3 \cdot (d \cdot i + e' + i') + e' \cdot i' \cdot (a' \cdot b' + c' \cdot d')$$

An examination of the table of FIG. 9 shows the same kind of overlap as described above for the decoding of bit 'a' to 'A'. In this case, a gate can be saved by taking advantage of the overlap and deleting the term $Px3 \cdot d \cdot i$. The equation can thus be reduced to:

$$(a' + b') \cdot c' \cdot d \cdot (e=i) + Px3 \cdot (e' + i') + e' \cdot i' \cdot (a' \cdot b' + c' \cdot d')$$

In the logic diagram, the following abbreviations are used:

$$n7 = Px3 \cdot (e' + i')$$

$$CPLe = n0 + n7 + n5$$

Logic Equation for invalid Vectors R6, INVR6. There are a total of 16 invalid R6 vectors:

$$INVR6 = P40 + P04 + P3x \cdot e \cdot i + Px3 \cdot e' \cdot i'$$

A note about notation for net names in the decoding circuit diagrams: For the Boolean operators, the identical letters are use as for the encoding diagrams, but they are capitalized (A, O, N, E, UE) to avoid confusion with some of the lower case letters abcdeifghj which represent the coded bits.

B. 6B/5B Disparity Checks

A circuit 1000B for performing 6B/5B disparity checks is shown in FIG. 10B. Disparity check circuit 1000B comprises NAND gates 1001B through 1027B, NOR gates 1030B, and AOI blocks 1040B through 1044B.

The column 'DR' of the table of FIG. 9 lists the required disparity at the start of the respective 6B vectors and the column 'DR Class' identifies the respective input bit patterns. The conventional column DB of "The ANSI Fibre Channel Transmission Code," incorporated by reference above, has been changed to DU and presently lists a positive or negative exit disparity for the disparity dependent vectors only. Disparity independent vectors have no entry in the DU column. In the conventional design of "The ANSI Fibre Channel Transmission Code," disparity independent vectors passed the input disparity to the output. In other words, if a current vector was a disparity independent vector, then the output disparity of the current vector was set to the input disparity. In the new design disclosed herein, disparity independent vectors are ignored and bypassed for disparity purposes for shorter delay. Short delay is especially important for the DU outputs PDUR6 and NDUR6 shown in FIG. 10B (NPDUR6 is the inverse of PDUR6) because they are in a critical path. To achieve this goal, a dedicated column 'DU Class' has been added which sorts the received vectors into DU classes in the most efficient way and so that disparity forwarding or determination for disparity independent vectors is not performed.

Logic Equations for Required Input Disparity DRR6. The terms DRR6 and NDRR6 represent the R6 vectors (i.e., the received vectors having six its) which require a positive or negative running disparity, respectively, at the start of he vector. Contrary to conventional implementations, all invalid vectors starting with P40 or P04 have been left out of the equations because of their redundancy in the overall error checking scheme. In other words, the vectors starting with P40 or P04 are invalid, so there is no reason to use these in disparity determinations.

$$PDRR6 = Px3 \cdot (e' + i') + a' \cdot b' \cdot c' + (a \cdot b \cdot c)' \cdot d' \cdot e' \cdot i' + Px2 \cdot e' \cdot i'$$

$$NDRR6 = P3x \cdot (e+i) + a \cdot b \cdot c + (a' \cdot b' \cdot c')' \cdot d \cdot e \cdot i + P2x \cdot e \cdot i$$

Boolean operations reduce this to:

$$PDRR6 = Px3 \cdot (e' + i') + a' \cdot b' \cdot c' + e' \cdot i' \cdot [Px2 + d' \cdot (a \quad b \cdot c)']$$

$$NDRR6 = P3x \cdot (e+i) + a \cdot b \cdot c + e \cdot i \cdot [P2x + d \cdot (a' \cdot b' \cdot c')']$$

In FIG. 10B, the following abbreviations are used for net names:

$$n20 = (a \cdot b \cdot c)' \cdot d'$$

$$n21 = (a' \cdot b' \cdot c')' \cdot d$$

$$n22 = PDRR4 \cdot NDRR6'$$

$$n23 = NDRR4 \cdot PDRR6'$$

Logic Equation for Monitoring Bate Disparity Violations. Bytes with only disparity independent vectors R6 and R4 are ignored for disparity checking purposes. There is a disparity violation DVBY at a specific byte under the following conditions:

1. The required entry disparity of the R6 vector does not match the running disparity at the front of the byte.
2. The R6 vector is disparity independent and the required entry disparity of the R4 vector does not match the running disparity in front of the byte.

For implementation with reduced delay in a critical path, the disparity independence of the vector R6 is not determined. Instead, the entry disparity of vector R4 is compared with the disparity in front of the byte and an error is flagged on a mismatch, except when the vector R6 has a required entry disparity that matches the running disparity.

A disparity violation internal to a byte from a disparity dependent R4 vector mismatched to a disparity dependent R6 vector is included in the set of invalid bytes, but not in DVBY. The disparity violation DVBY at a byte is thus given by the equation:

$$DVBY = = NDFBY \cdot (PDRR6 + PDRR4 \cdot NDRR6') + PDFBY(NDRR6 + NDRR4 \cdot PDRR6')$$

The terms PDFBY and NDFBY represent a positive or negative running disparity, respectively, at the front of the byte.

If needed, one level of gating (NAND gates 1027B and 1026B in FIG. 10B) in the above equation can be eliminated by merging the AND gates 1025B and 1024B with the NDRR6 and PDRR6 functions. The two AOI222 gates 1043B and 1044B are then first duplicated, changed to the non-inverting version and expanded to AO2222 (i.e., four two-input AND gates followed by a four-input OR gate) to generate PNDR and PDR directly.

Logic Equations for the assumed ending Disparities PDUR6 and NDUR6. The logic equations for the generation of the exit disparities PDUR6 and NDUR6, for invalid vectors PV6, and for the disparity violations are listed and explained on page 19 of "The ANSI Fibre Channel Transmission Code," which has been incorporated by reference above. Some simplifications have been made herein. For the expressions PDBR6 and NDBR6, the terms P40 and P04 have been replaced by P40·(e+i) and P04·(e'+i'), respectively. The terms P40 and P04 in the coded domain can be generated only by at least one error. For the case of a single error and e=i, the R6 vector was obviously initially balanced and so should not generate PDUR6 or NDUR6 which would generate a superfluous code violation at the next disparity dependent vector in addition to the invalid vector at the actual error location. Therefore:

$$PDUR6=P3x\cdot(e+i)+d\cdot e\cdot i+P2x\cdot e\cdot i=P3x\cdot(e+i)+e\cdot i\cdot(d+P2x)$$

$$NDUR6=Px3\cdot(e'+i')+d'\cdot e'\cdot i'+Px2\cdot e'\cdot i'=Px3\cdot(e'+i')+e'\cdot i'\cdot(d'+Px2)$$

C. 4B/3B Decoder, Error Checks

Figure 13:
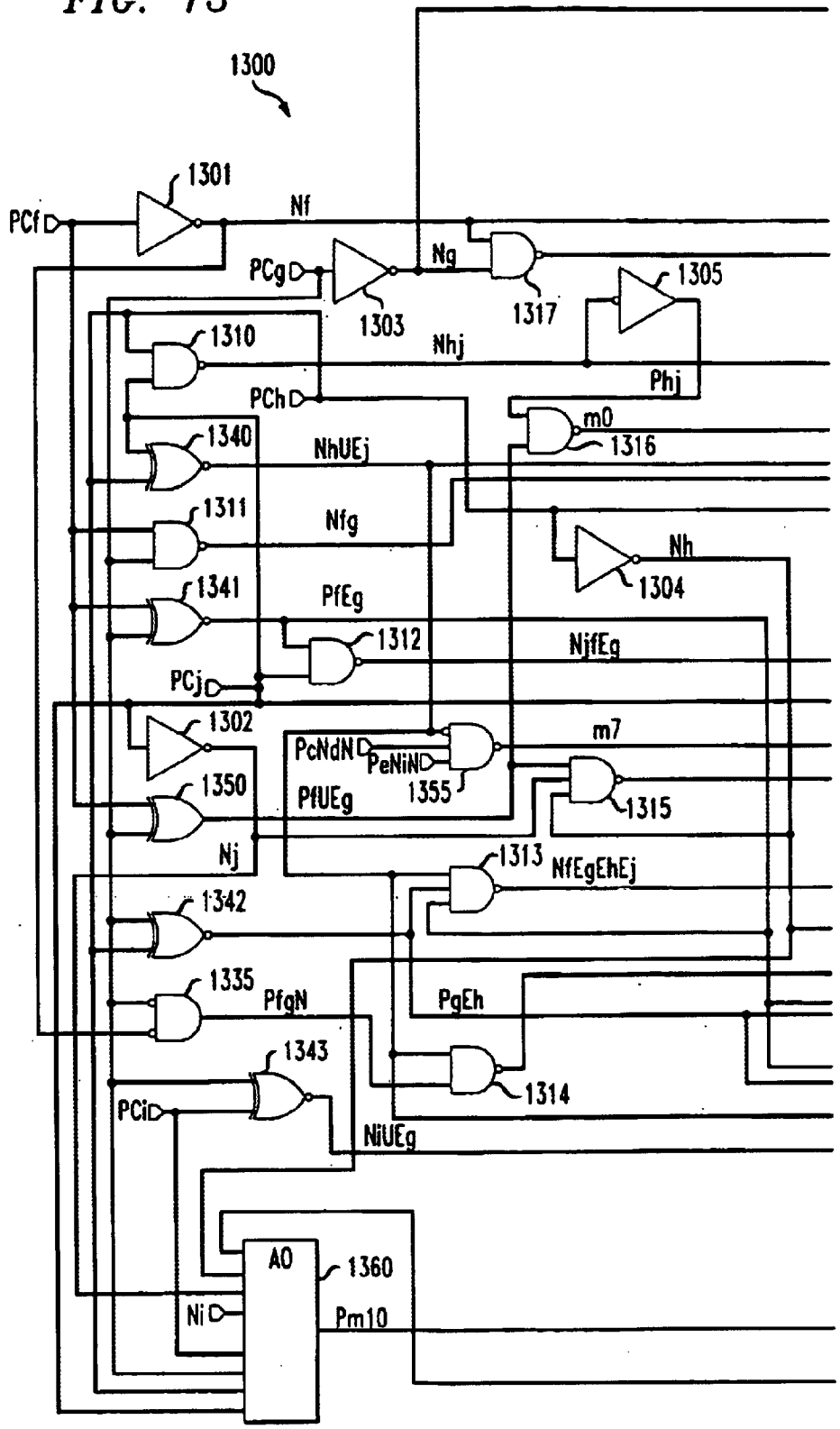
FIG. 13 illustrates an exemplary circuit for performing 4B/3B decoding and related error checks when decoding a 4B/3B portion of a 10B/8B transmission code, in accordance with one embodiment of the present invention.
Figure 13:
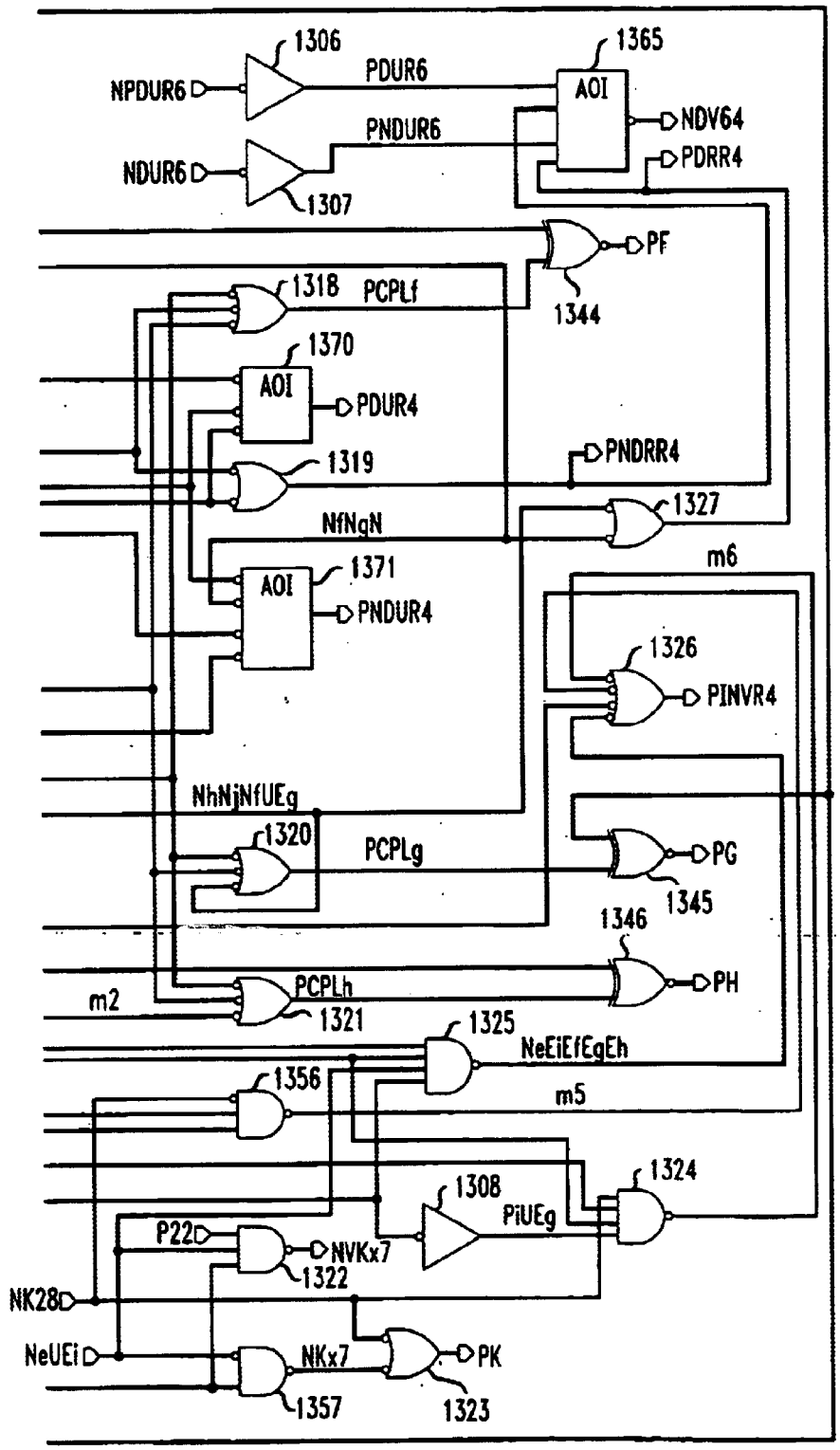

FIG. 13 shows a decoding and error checking circuit 1300 for decoding and error checking a 4B/3B transmission code. Decoding and error checking circuit 1300 comprises inverters 1301 through 1308, NAND gates 1310 through 1327, NANDN1 gates 1355 through 1357, XNOR 1340 through 1346, XOR gate 1350, AO block 1360, AOI block 1365, and OAI blocks 1370 and 1371.

Logic Equations for the Generation of the decoded Bits F, G, H, K. Generally, F=f, G=g, H=h, except for the conditions listed in the table of FIG. 12 with an F (False) entry for which the complement of the respective coded bit is generated, e.g., H=h'.

In the table shown in FIG. 11, the Decoding Class for the lines D/Kx.3 (0011), D/Kx.4 (1101), and Dx.7 (0001) all have been changed to (f=g)·j, and similar changes have been made for other vector classifications. This leads to simplified equations on the last five rows of the Classifications column in the table shown in FIG. 12. With this change, the following decoding equations are extracted from the table shown in FIG. 12 and are carried out by the decoding and error checking circuit 1300 of FIG. 13:

1. F=f'iff (if and only if):

$$(f\neq g)\cdot h\cdot j+(f=g)\cdot j+c'\cdot d'\cdot e'\cdot i'\cdot(h\neq j)$$

In the logic diagram, the following abbreviations are used:

$$m0=(f\neq g)\cdot h\cdot j$$

$$m7=c'\cdot d'\cdot e'\cdot i'\cdot(h\neq j)$$

$$CPLf=m0+(f=g)\cdot j+m7$$

2. G=g'iff:

$$(f\neq g)\cdot h'\cdot j'+(f=g)\cdot j+c'\cdot d'\cdot e'\cdot i'\cdot(h\neq j)$$

$$CPLg=(f\neq g)\cdot h'\cdot j'+(f=g)\cdot j+m7$$

3. H=h'iff:

$$f\cdot g'\cdot(h=j)+(f=g)\cdot j+c'\cdot d'\cdot e'\cdot i'\cdot(h\neq j)$$

Define:

$$m2=f\cdot g'\cdot(h=j)$$

$$CPLh=m2+(f=g)\cdot j+m7$$

Logic Equation for Control Bit K.

$$K=(K28+Kx.7)=(c=d=e=i)+(e\neq i)\cdot(i=g=h=j)$$

For reduced delay, the above equation is implemented as follows:

$$K=c\cdot d\cdot e\cdot i+c'\cdot d'\cdot e'\cdot i'+(e\neq i)\cdot(i\cdot g\cdot h\cdot j+i'\cdot g'\cdot h'\cdot j')$$

In the logic diagram, the following abbreviations are used:

$$m10=i\cdot g\cdot h\cdot j+i'\cdot g'\cdot h'\cdot j'$$

$$Kx7=m10\cdot(e\neq i)$$

Logic Equations for the required Disparity at the Front of the R4 Vector. The terms PDRR4 and NDRR4 represent the required positive or negative disparity, respectively, at the front of the R4 vector.

$$PDRR4=f\cdot g'+(f\neq g)\cdot h'\cdot j'$$

$$NDRR4=f\cdot g+(f\neq g)\cdot h\cdot j=f\cdot g+m0$$

Logic Equations for the assumed ending Disparities PDUR4 and NDUR4.

$$PDUR4=h\cdot j+f\cdot g\cdot(h\neq j)$$

$$NDUR4=h'\cdot j'+f'\cdot g'\cdot(h\neq j)$$

Logic Equation for invalid Vector R4, INVR4. There are a total of two inherently invalid R4 vectors: all ones or all zeros (f=g=h=j). Some invalid combinations of R6 and R4 vectors are also detected in this circuit complex and lumped together in the signal IVR4, such as violations of the S-function rules (e=i=f=g=h), and Kx.7 control characters with R6 vectors of the P22 class. In conventional designs, these unsuitable R6 vectors were classified as balanced vectors, which leads to a more complicated circuit. The K28·(f=g=h) character is a valid control character in terms of coding constraints, but is not included in the 8B/10B alphabet because it would require special encoding circuits. It is included in the group of invalid characters.

If the following conditions are met then an invalid Kx.7 control character has been received:

$$VKx7=(i\cdot g\cdot h\cdot j+i'\cdot g'\cdot h'\cdot j')\cdot(e\neq i)\cdot P22=m10\cdot(e\neq i)\cdot P22$$

Other invalid R4 vectors are lumped together in the signal INVR4:

$$INVR4=(f=g=h=j)+(e=i=f=g=h)+K28\cdot(f=g=h)+K28'\cdot(i\neq g=h=j)$$

Define:

$$m5=K28(f=g=h)$$

$$m6=K28'\cdot(i\neq g=h=j)$$

$$INVR4=(f=g=h=j)+(e=i=f=g=h)+m5+m6$$

D. 10B/8B Decoder, Error Checks

Figure 14:
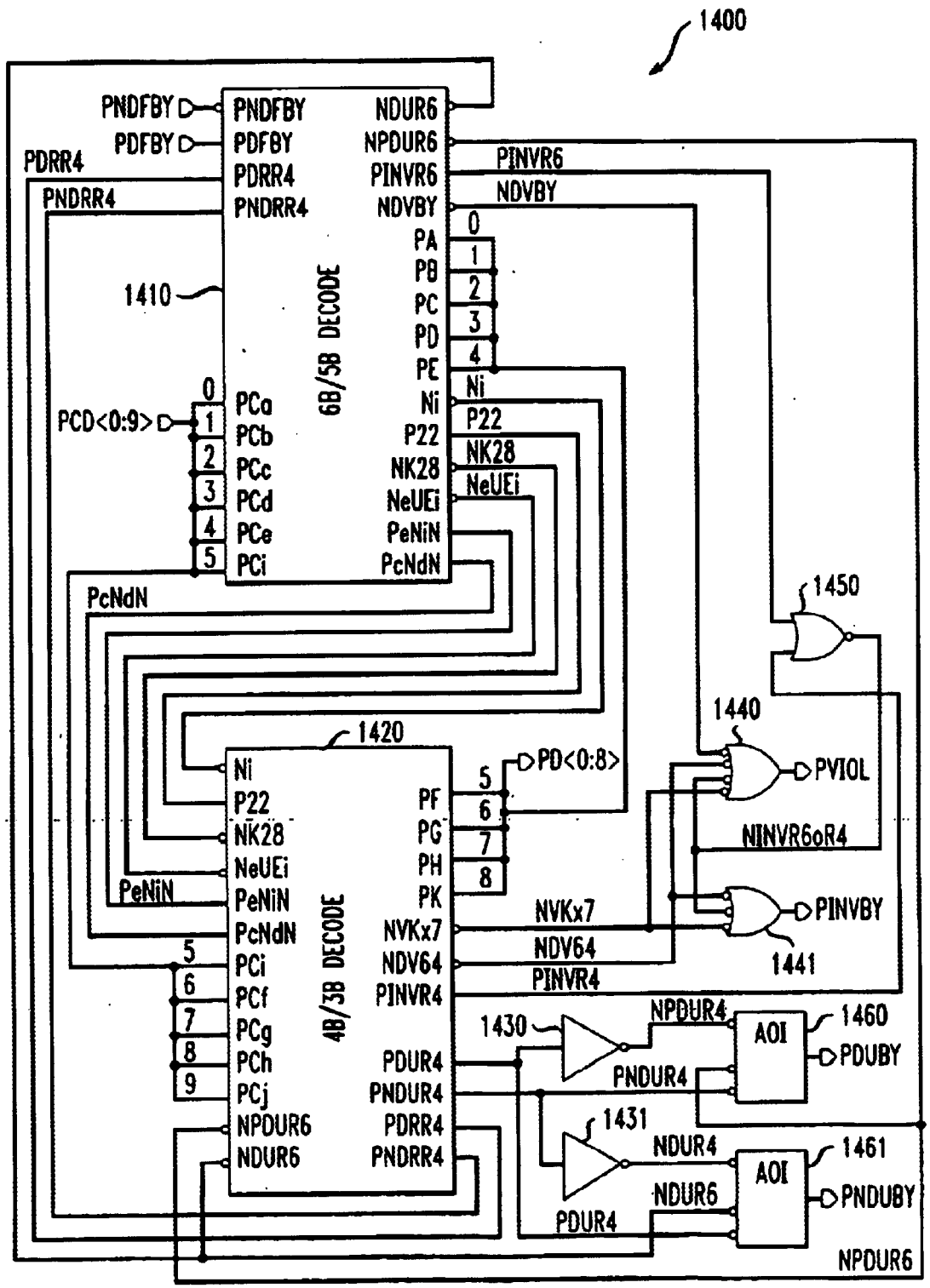
FIG. 14 illustrates an exemplary circuit for performing error checks when decoding both the 4B/3B portion and the 6B/5B portion of a 10B/8B transmission code, in accordance with one embodiment of the present invention.

A circuit 1400 for decoding and performing error checks for a 10B/8B transmission code is shown in FIG. 14. Circuit 1400 comprises 6B/5B decode block 1410, 4B/3B decode block 1420, inverters 1430 and 1431, NAND gates 1440 and 1441, NOR gate 1450, and OAI blocks 1460 and 1461. 6B/5B decode block 1410 is the circuit 1000A and 1000B shown in FIGS. 10A and 10B, respectively. 4B/3B decode block 1420 is the circuit shown in FIG. 13.

Error Reporting

This circuit 1400 merges the 6B/5B decoder 1410 and 4B/3B decoder 1420 into a byte decoder and generates the signal PINVBY, which indicates an inherently invalid byte. This includes disparity violations NDV64, which are evident from an examination of just the 10 coded bits of the current byte. The signal PVIOL signals either an invalid byte or a disparity violation NDVBY detected at this location, which may result from an error in this or a preceding byte.

Disparity Monitoring

If either one or both of the vectors are disparity dependent, either PDUBY or PNDUBY are asserted to establish a positive or negative running disparity, respectively, at the end of the byte:

$$PDUBY=PDUR4+PDUR6 \cdot NDULR4'$$

$$NDUBY=NDUR4+NDUR6 \cdot PDUR4'$$

E. Byte Disparity, Fast Version

Notation

The signal names PDFBY and NDFBY refer to a positive and negative running disparity, respectively, in front of the byte. The signal names PDUBY and NDUBY refer to the assumed positive or negative exit disparity, respectively, of the byte, regardless of the starting disparity at the front end. If neither the 6B vector nor the 4B vector of the byte is disparity dependent, none of the two outputs is asserted.

Figure 15:
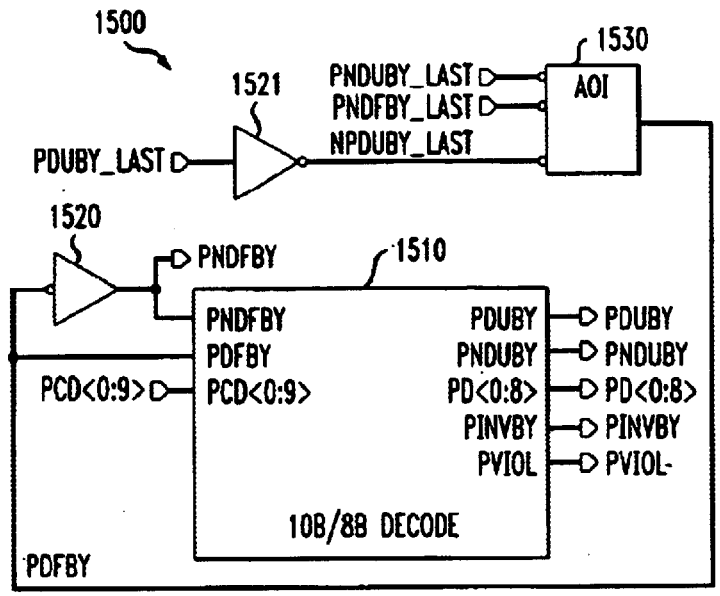
FIG. 15 illustrates a relatively fast version of an exemplary circuit for disparity determination for a one-byte decoder in accordance with one embodiment of the present invention.

FIG. 15 shows a byte disparity circuit 1500, which comprises a 10B/8B decode block 1510, inverters 1520 and 1521, and OAI block 1530. The 10B/8B decode block 1510 is the circuit shown as circuit 1400 of FIG. 14.

The values for the outputs NDFBY, PDUBY, and PNDUBY are stored in three latches (not shown in the diagrams) which are clocked concurrently with the decoded data output. The outputs of the latches are labeled NDFBY_LAST, PDUBY_LAST, and PNDUBY_LAST, respectively, and are used for the computation of the starting disparity NDFBY for the next byte.

Logic Equations for the Determination of the Disparity at the Start of the Byte.

PDFBY=PDUBY_LAST+PDFBY_LAST·NDUBY_LAST

Note that NDFBY and PDFBY are complementary: NDFBY=PDFBY'.

The values of PDUBY and NDUBY are exclusive, none or one alone can be true.

The circuit of FIG. 15 is similar to the circuit of FIG. 5 in that the running disparity at a beginning of a previous byte and the exit parity of the previous byte are used during the current cycle calculations, which speeds processing.

F. Byte Disparity, Slower Version

Figure 16:
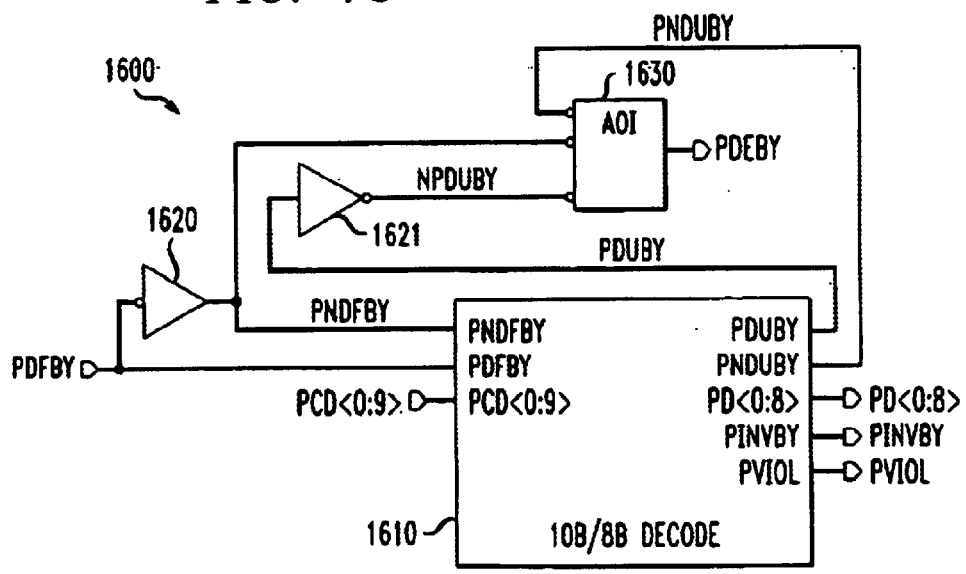
FIG. 16 illustrates a relatively slow version of an exemplary circuit for disparity determination for a one-byte decoder in accordance with one embodiment of the present invention.

A circuit 1600, which is a slower version for generating the running disparity at the end of a byte, is shown in FIG. 16. Circuit 1600 comprises a 10B/8B decoder 1610 (basically equivalent to decoder 1510), inverters 1620, 1621, and an OAIblock 1630.

An incentive to use the slower version is the saving of two latches. If timing is not critical, the ending disparity PDEBY is generated in the same cycle as the decoding and the error checks. So only this single parameter must be passed on to next cycle in the traditional manner. The output of this latch (the latch is not shown) is the signal PDFBY, the disparity in front of the new byte. If the longest delay path is to the PDEBY output, delays associated with one inverter plus one OAI21 gate have been added to the critical path.

This is slower because the circuit 1600 uses the running disparity at the end of the previous byte along with the disparity at the end of the current byte.

G. Four-Byte Word Decoder

A four-byte word decoder is shown in FIG. 17. Four-byte word decoder 1700 comprises 10B/8B decode blocks 1710, 1711, 1712, and 1713, inverters 1720 through 1727, NOR gates 1730 through 1734, OAI blocks 1740 through 1742, and AO blocks 1750 through 1752.

Notation.

The signal names PDFBY0 and NDFBY0 refer to a positive and negative disparity, respectively, in front of byte #0.

The signal names PDUBY0 and NDUBY0 refer the assumed positive or negative exit disparity, respectively, of byte #0. If neither the 6B vector nor the 4B vector of the byte is disparity dependent, none of the two outputs is asserted.

The values for the outputs PDFBY3, PNDFBY3, PDUBY3, and PNDUBY3 are stored in the latches (not shown) that provide the signals PDFBY3_LAST, PNDFBY3_LAST, PDUBY3_LAST, and PNDUBY3, respectively, for the computation of the starting disparities PDFBY0 and PNDFBY0 for the next word cycle at the top of the diagram.

Logic Equations for the Determination of the Dislparity at the Start of the Bytes.

PDFBY0=PDUBY3_LAST+PDFBY3_LAST NDUBY3_LAST'

NDFBY0=NDUBY3 LAST+NDFBY3_LAST PDUBY3_LAST'

The values of PDFBY0 and NDFBY0 are complementary, but the values of PDUBY3 and NDUBY3 are exclusive, none or one alone can be true.

To minimize the circuit delays, the disparity values for the front of byte #1, #2, and #3 are determined not sequentially from byte to byte, but based on the disparity in front of byte #0 and the changes in disparity contributed by the byte(s) in between.

PDFBY1=PDUBY0+PDFBY0·NDUBY0'

NDFBY1=NDUBY0+NDPBY0·PDUBY0'

PDFBY2=PDUBY1+PDUBY0·NDUBY1'+PDFBY0·NDUBY0'·NDUBY1' n0=NDUBY0+NDUBY1

PDFBY2=PDUBY1+PDUBY0·NDUBY1'+PDFBY0·n0'

NDFBY2=NDUBY1+NDUBY0·PDUBY1'+NDFBY0·PDUBY0'·PDUBY1' n1=PDUBY0+PDUBY1

NDFBY2=NDUBY1+NDUBY0·PDUBY1'+NDFBY0·n1'

PDFBY3=PDUBY2+PDUBY1·NDUBY2'+PDUBY0·NDUBY1'·NDUBY2'·PDFBY0'·NDUBY0'·NDUBY1'·NDUBY2' n2=NDUBY0+NDUBY1+NDUBY2 n3=NDUBY1+NDUBY2

PDFBY3=PDUBY2+PDUBY1·NDUBY2'+PDUBY0·n3'·PDFBY0·n2'

NDFBY3=NDUBY2+NDUBY1·PDUBY2'+NDUIBY0·PDUBY1'·PDUBY2'·NDFBY0'·PDUBY0'·PDUBY1'·PDUBY2' n4=PDUBY0+PDUBY1+PDUBY2 n5=PDUBY1+PDUBY2

NDFBY3=NDUBY2+NDUBY1double-thicknessPDUBY2'+NDUBY0·n5'·NDFBY0·n4'

In the circuit 1700 implementation of FIG. 17, the following relationships are advantageously used:
PNDFBY1=PDFBY1'
PNDFBY2=PDFBY2'

These signals are not in the critical path and the added inversion does not decrease the maximum rate. For applications which have sufficient timing margin, the same simplifications can also be used for the signal PNDFBY3 and perhaps PNDFBY3 at a penalty of one inversion for each of those two signals.

It is to be understood that the embodiments and variations shown and described herein are merely illustrative of the principles of this invention and that various modifications may be implemented by those skilled in the art without departing from the scope and spirit of the invention.

What is claimed is:

1. A method for determining a running disparity at a current vector boundary for balanced binary codes that have a running disparity of plus or minus one at any vector boundary, comprising:

setting the ruing disparity to a complementary disparity of a disparity at a preceding reference point when there is an odd number of unbalanced vectors between the preceding reference point and the current vector boundary; and setting the running disparity to the disparity at the preceding reference point when there is an even number of unbalanced vectors between the preceding reference point and the current vector boundary.

2. The method of claim 1, further comprising the step of determining whether there is an even or odd number of vectors between the preceding reference point and the current vector boundary.

3. The method of claim 2, wherein each of the steps of the method comprises a number of substeps and at least one of the substeps of one or more of the method steps is performed in a next encoding cycle and is based on stored values, from a current encoding cycle, of the disparity at the reference point and disparity attributes of vectors occurring between the reference point and the current vector boundary.

4. The method of claim 2, further comprising, when there is an even number of vectors between the preceding reference point and the current vector boundary, the steps of:

determining whether there is an even or odd number of balanced vectors between the preceding reference point and the current vector boundary;

setting the running disparity to match the disparity at the reference point when there is an even number of balanced vectors; and setting the running disparity to the complement of the disparity at the reference point when there is an odd number of balanced vectors.

5. The method of claim 4, wherein at least one of the steps of the method is performed in a next encoding cycle and is based on stored values, from a current encoding cycle, of the disparity at the reference point and disparity attributes of vectors occurring between the reference point and the current vector boundary.

6. The method of claim 5, wherein all of the steps of the method are performed in the next encoding cycle.

7. The method of claim 2, further comprising, when there is an odd number of vectors between the preceding reference point and the current vector boundary, the steps of:

determining whether there is an even or odd number of balanced vectors between the preceding reference point and the current vector boundary;

setting the running disparity to match the disparity at the reference point when there is an odd number of balanced vectors; and setting the running disparity to the complement of the disparity at the reference point when there is an even number of balanced vectors.

8. The method of claim 7, wherein at least one of the steps of the method is performed in a next encoding cycle and is based on stored values, from a current encoding cycle, of the disparity at the reference point and disparity attributes of vectors occurring between the reference point and the current vector boundary.

9. The method of claim 8, wherein all of the steps of the method are performed in the next encoding cycle.

10. A circuit for encoding, comprising:

an 8B/10B encoder adapted to encode five-bit source vectors into six-bit coded vectors and encode three-bit source vectors into four-bit coded vectors, thereby creating 10-bit coded bytes from eight input bits; and a disparity circuit adapted to determine a starting disparity at a front of a coded byte based on a running disparity at a front of a preceding coded byte and a value of a single bit parameter which indicates whether the preceding coded byte is balanced.

11. The circuit of claim 10, wherein the 8B/10B encoder further comprises a 5B/6B encoding circuit adapted to set a third coded bit of a six-bit coded vector to a one when the 5B/6B encoding circuit detects that in a five-bit source vector the third bit is a one, or that the first four bits have a value of zero, or that the first three bits have a value of zero and a trailing bit is a one.

12. The circuit of claim 11, wherein the 5B/6B encoding circuit is further adapted to set a fifth coded bit of a six-bit coded vector to a one when the 5B/6B encoding circuit detects in a five-bit source vector that the trailing bit is a one but the leading four bits are not three zeros followed by a one, or that both the last two bits have values of zero combined with a single bit of the first three bits having a value of one, or that the three leading bits have values of zeros followed by the fourth bit having a value of one and the trailing bit having a value of zero.

13. The circuit of claim 12, wherein the 5B/6B encoding circuit is further adapted to set the trailing coded bit of a six-bit coded vector to a value of one when the 5B/6B encoding circuit detects in a five-bit source vector that the two trailing bits have values of zero and a single bit of the leading three bits has a value of zero, or that either a control input has a value of one or a pair of trailing bits are unequal and a single bit of the leading three bits has a value of one, or that the four leading bits have values of zero and the trailing bit has a value of one, or that all five bits have values of one.

14. The circuit of claim 13, wherein the 5B/6B encoding circuit is further adapted to determine that a positive running disparity is required at the front end of a six-bit coded vector when the 5B/6B encoding circuit detects in a five-bit source vector that the three leading bits have values of zeros and the trailing bit has a value of zero, or that the three leading bits have values of zeros followed by the fourth bit having a value of one, or that the four leading bits have values of one and the trailing bit has a value of zero, or that the two trailing bits are zero combined with a single bit of the leading three bits having a value of one.

15. The circuit of claim 14, wherein the 5B/6B encoding circuit is further adapted to determine that a negative running disparity is required at a front end of a six-bit coded vector when the 5B/6B encoding circuit detects in a five-bit source vector that the three leading bits and a trailing bit have values of one, or that three leading bits have values of one followed by the fourth bit that has a value of zero, or that the four leading bits have values of zeros and the trailing bit has a value of one, or that the two trailing bits have a value of one combined with a single bit of the leading three bits having a value of zero, or that the control line has a value of one.

16. The circuit of claim 15, wherein the 5B/6B encoding circuit is further adapted to determine that a six-bit coded vector is balanced when the 5B/6B encoding circuit detects in a five-bit source vector that a single bit of the leading three bits has a value of zero combined with at least one of the two trailing bits having a value of zero, or that a single bit of the leading three bits has a value of one combined with at least one of the trailing two bits has a value of one and the control input has a value of zero, or that the three leading bits have values of one combined with a pair of trailing bits with values of zero.

17. The circuit of claim 10, wherein the 8B/10B encoder further comprises a 3B/4B encoding circuit adapted to determine that a four-bit encoder vector is balanced if it detects that in the three-bit source vector either the leading two bits have unequal values or have both a value of one followed by a trailing bit having a value of zero.

18. A block encoder comprising:
a plurality of 8B/10B encoders operating in parallel, each 8B/10B encoder encoding five-bit source vectors into six-bit coded vectors and encoding three-bit source vectors into four-bit coded vector, thereby creating 10-bit coded bytes from eight input bits; and
a disparity circuit adapted to determine a starting disparity at a front of one of the 10-bit coded bytes based on a ruining disparity at a reference point, an odd or even number of coded bytes between the reference point and the one 10-bit coded byte and the odd or even number of balanced bytes between the reference point and the one 10-bit coded byte.

19. The block encoder of claim 18, wherein the disparity circuit is adapted to set the running disparity identical to the disparity at the reference point when the number of bytes between the reference point and the one 10-bit coded byte is odd and a number of balanced vectors between the reference point and the one 10-bit coded byte is also odd, and the disparity circuit is adapted to set the running disparity to the complement of the disparity at the reference point when the number of balanced vectors is even.

20. The block encoder of claim 18, wherein the disparity circuit is adapted to set the running disparity identical to the disparity at the reference point when the number of bytes between the reference point and the one 10-bit coded byte is even and a number of balanced vectors between the reference point and the one 10-bit coded byte is also even, and the disparity circuit is adapted to set the running disparity to the complement of the disparity at the reference point when the number of balanced vectors is odd.

21. A method for detecting a disparity violation at a front of a byte for balanced binary codes that have a running disparity of plus or minus one at any byte boundary, the method comprising:
determining a required front end disparity of the byte; and
comparing the required front-end disparity of the byte with an actual running disparity by setting the actual running disparity equal to an exit disparity of a next preceding byte that is disparity dependent.

22. A circuit for decoding 10B/8B coded bytes, the circuit comprising:

a 10B/8B decoder adapted to decode six-bit coded vectors into five-bit source vectors and decode four-bit coded vectors into three-bit source vectors, thereby creating eight-bit decoded bytes from 10-bit coded bytes; and
a disparity circuit adapted to compare a required front-end disparity of a 10-bit coded byte with an actual running disparity by setting the actual running disparity equal to an exit disparity of a next preceding 10-bit coded byte that is disparity dependent.

23. The circuit of claim 22, wherein the 10B/8B decoder further comprises a 6B/5B decoding circuit which complements a leading coded bit of a six-bit coded vector when the 6B/5B decoding circuit detects, in the six-bit coded vector, one of the following five bit-configurations: (1) a pair of trailing bits having equal values, a fourth bit has a value of one, a third bit has value of zero, and the pair of leading bits has at least one value of zero; (2) there are three or four bits with a value of one in the leading four bits and the trailing bit has a value of one; (3) there are three or four bits with a value of zero in the leading four bit combined with a value of zero in the fifth bit or a value of one in the fourth and the trailing positions; (4) the pairs of leading and trailing bits all have a value of one; and (5) the trailing four bits all have a value of zero.

24. The circuit of claim 23, wherein the 6B/5B decoding circuit is further adapted to complement the second coded bit of a six-bit coded vector when the 6B/5B decoding circuit detects, in the six-bit coded vector, one of the following five bit-configurations: (1) the pair of trailing bits have equal values, the pair of leading bits have unequal values, the third bit has a value of one and the fourth bit has a value of zero; (2) there are three or four bits with a value of one in the leading four bits and the trailing bit has a value of one; (3) there are three or four bits with a value of zero in the leading four bits combined with a value of zero in the fifth bit or a value of one in the fourth and the trailing positions; (4) the pairs of leading and trailing bits all have a value of one; and (5) the trailing four bits all have a value of zero.

25. The circuit of claim 24, wherein the 6B/5B decoding circuit is further adapted to complement the third coded bit of a six-bit coded vector when the 6B/5B decoding circuit detects, in the six-bit coded vector, one of the following five bit-configurations: (1) the pair of trailing bits have equal values, the third and the fourth bit have unequal values, the leading bit has a value of zero, and the second has value of one; (2) there are three or four bits with a value of one in the leading four bits and the trailing bit has a value of one; (3) there are three or four bits with a value of zero in the leading four bits combined with a value of zero in the fifth bit or a value of one in the fourth and the trailing position; (4) the pairs of leading and trailing bits all have a value of zero; and (5) the trailing four bits all have a value of zero.

26. The circuit of claim 25, wherein the 6B/5B decoding circuit is further adapted to complement the fourth coded bit of a six-bit coded vector when the 6B/5B decoding circuit detects, in the six-bit coded vector, one of the following five bit-configurations: (1) the pair of trailing bits have equal values, the third and the fourth bit have unequal values, the first bit has a value of one, and the second bit has value of zero; (2) there are three or four bits with a value of one in the leading four bits and the trailing bit has a value of one; (3) there are three or four bits with a value of zero in the leading four bits combined with a value of zero in the fifth bit or a value of one in the fourth and the trailing position; (4) the pairs of leading and trailing bits all have a value of one; and (5) the trailing four bits all have a value of zero.

27. The circuit of claim 26, wherein the 6B/5B decoding circuit is further adapted to complement the fifth coded bit of a six-bit coded vector when the 6B/5B decoding circuit detects, in the six-bit coded vector, one of the following four bit-configurations: (1) the pair of trailing bits have equal values, the fourth bit has a value of one, the third bit has a value of zero, and there is at least one zero in the pair of leading bits; (2) there are three or four bits with a value of zero in the leading four bits and there is at least one zero in the pair of trailing bits; (3) the pairs of leading and trailing bits all have a value of zero; and (4) the trailing four bits all have a value of zero.

28. The circuit of claim 22, wherein the 10B/8B decoding circuit further comprises a 4B/3B decoder adapted to complement a leading coded bit of a four-bit coded vector when the 3B/4B decoding circuit detects, in the four-bit coded vector, one of the following three bit-configurations: (1) the pair of leading bits have unequal values and the pair of trailing bits have values of one; (2) the pair of leading bits have equal values and the trailing bit has a value of one; and (3) the pair of trailing bits have unequal values and the trailing four bits of a preceding six-bit vector all have a value of zero.

29. The circuit of claim 28, wherein the 4B/3B decoder is further adapted to complement the second coded bit of a four-bit coded vector when the 3B/4B decoding circuit detects, in the four-bit coded vector, one of the following three bit-configurations: (1) the pair of leading bits have unequal values and the pair of trailing bits have values of zero; (2) the pair of leading bits have equal values and the trailing bit has a value of one; and (3) the pair of trailing bits have unequal values and the trailing four bits of the preceding six-bit vector all have a value of zero.

30. The circuit of claim 29, wherein the 4B/3B decoder is further adapted to complement the third coded bit of a four-bit coded vector when the 3B/4B decoding circuit detects, in the four-bit coded vector, one of the following three bit-configurations: (1) the pair of trailing bits have equal values, the leading bit has value of one, and the second bit has a value of zero; (2) the pair of leading bits have equal values and the trailing bit has a value of one; and (3) the pair of trailing bits have unequal values and the trailing four bits of the preceding six-bit vector all have a value of zero.

31. The circuit of claim 22, wherein the 10B/8B decoding circuit further comprises a 6B disparity error detection circuit adapted to assign a positive required front-end disparity to any six-bit coded vector when the 6B disparity error detection circuit detects one of the following four bit-configurations in the six-bit coded vector: (1) there are three or four bits with a value of zero in the leading four bits and there is at least one bit with values of zero in the pair of trailing bits; (2) the three leading bits all have a value of zero; (3) there are two or three bits with a zero value in the leading three bits and the trailing pair of bits have values of zero; and (4) the three trailing bits all have a value of zero and the three leading bits have values other than all one.

32. The circuit of claim 31, wherein the 6B disparity error detection circuit is further adapted to assign a negative required front end disparity to any six-bit coded vector when the 6B disparity error detection circuit detects one of the following four bit-configurations in the six-bit coded vector: (1) there are three or four bits with a one value in the leading four bits and there is at least one bit with a value of one in the pair of trailing positions; (2) the three leading bits all have a value of one; (3) there are two or three bits with a value of one in the leading three bits and the trailing pair of bits have values of one; and (4) the three trailing bits all have a value of one and the three leading bits have values other than all zero.

33. The circuit of claim 32, wherein the 6B disparity error detection circuit is further adapted to assign a positive exit disparity to any six-bit coded vector when the 6B disparity error detection circuit detects one of the following three bit-configurations in the six-bit coded vector: (1) there are three or four bits with a value of one in the leading four bits and there is at least one bit with a value of one in the pair of trailing bits; (2) the three trailing bits all have a value of one; and (3) there are two or three bits with a value of one in the leading three bits and the trailing pair of bits have values of one.

34. The circuit of claim 33, wherein the 6B disparity error detection circuit is further adapted to assign a negative exit disparity to any six-bit coded vector when the 6B disparity error detection circuit detects one of the following three bit-configurations in the six-bit coded vector: (1) there are three or four bits with a value of zero in the leading four bits and there is at least one bit with a value of zero in the pair of trailing positions; (2) the three trailing bits all have a value of zero; and (3) there are two or three bits with a value of zero in the leading three bits and the trailing pair of bits have values of zero.

35. The circuit of claim 22, wherein the 10B/8B decoding circuit further comprises a 4B disparity error detection circuit adapted to assign a positive required front end disparity to any four-bit coded vector when the 4B disparity error detection circuit detects one of the following two bit-configurations in the four-bit coded vector: (1) the leading pair of bits have values of zero; and (2) the trailing pair of bits have values of zero and the leading pair of bits have unequal values.

36. The circuit of claim 35, wherein the 4B disparity error detection circuit is further adapted to assign a negative required front end disparity to any four-bit coded vector when the 4B disparity error detection circuit detects one of the following two bit-configurations in the four-bit coded vector: (1) the leading pair of bits have values of one; and (2) the trailing pair of bits have values of one and the leading pair of bits have unequal values.

37. The circuit of claim 36, wherein the 4B disparity error detection circuit is further adapted to assign a positive exit disparity to any four-bit coded vector when the 4B disparity error detection circuit detects one of the following two bit-configurations in the four-bit coded vector: (1) the trailing pair of bits have values of one; and (2) the leading pair of bits have values of one and the trailing pair of bits have unequal values.

38. The circuit of claim 37, wherein the 4B disparity error detection circuit is further adapted to assign a negative exit disparity to any four-bit coded vector when the 4B disparity error detection circuit detects one of the following two bit-configurations in the four-bit coded vector: (1) the trailing pair of bits have values of zero; and (2) the leading pair of bits have values of zero and the trailing pair of bits have unequal values.

* * * * *